(12) United States Patent
Kim et al.

(10) Patent No.: US 8,785,289 B2
(45) Date of Patent: Jul. 22, 2014

(54) INTEGRATED DECOUPLING CAPACITOR EMPLOYING CONDUCTIVE THROUGH-SUBSTRATE VIAS

(71) Applicant: International Business Machines Corporation, Armonk, NY (US)

(72) Inventors: Tae Hong Kim, Austin, TX (US); Michael F. McAllister, New Milford, CT (US); Michael J. Shapiro, Austin, TX (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/975,519

(22) Filed: Aug. 26, 2013

(65) Prior Publication Data
US 2013/0344675 A1    Dec. 26, 2013

Related U.S. Application Data

(62) Division of application No. 12/614,883, filed on Nov. 9, 2009, now Pat. No. 8,558,345.

(51) Int. Cl.
H01L 21/20 (2006.01)
H01L 21/44 (2006.01)

(52) U.S. Cl.
USPC ..... 438/386; 438/667; 257/532; 257/E21.597

(58) Field of Classification Search
USPC ........... 257/301, 532, E21.597; 438/387, 667
See application file for complete search history.

(56) References Cited

U.S. PATENT DOCUMENTS

| | | | |
|---|---|---|---|
| 5,614,743 A * | 3/1997 | Mochizuki | 257/276 |
| 5,915,167 A | 6/1999 | Leedy | |
| 6,133,640 A | 10/2000 | Leedy | |
| 6,208,545 B1 | 3/2001 | Leedy | |
| 6,221,769 B1 * | 4/2001 | Dhong et al. | 438/667 |
| 6,551,857 B2 | 4/2003 | Leedy | |
| 6,563,224 B2 | 5/2003 | Leedy | |

(Continued)

FOREIGN PATENT DOCUMENTS

| CN | 1525485 | 4/1998 |
|---|---|---|
| CN | 101188235 | 4/1998 |

(Continued)

OTHER PUBLICATIONS

International Search Report and Written Opinion dated Nov. 9, 2010 issued in PCT/US2010/055949.

*Primary Examiner* — Cheung Lee
*Assistant Examiner* — Jeremy Joy
(74) *Attorney, Agent, or Firm* — Scully, Scott, Murphy & Presser, P.C.; Parashos T. Kalaitzis, Esq.

(57) ABSTRACT

A capacitor in a semiconductor substrate employs a conductive through-substrate via (TSV) as an inner electrode and a columnar doped semiconductor region as an outer electrode. The capacitor provides a large decoupling capacitance in a small area, and does not impact circuit density or a Si3D structural design. Additional conductive TSV's can be provided in the semiconductor substrate to provide electrical connection for power supplies and signal transmission therethrough. The capacitor has a lower inductance than a conventional array of capacitors having comparable capacitance, thereby enabling reduction of high frequency noise in the power supply system of stacked semiconductor chips.

18 Claims, 21 Drawing Sheets

(56) References Cited

U.S. PATENT DOCUMENTS

| | | |
|---|---|---|
| 6,632,706 B1 | 10/2003 | Leedy |
| 6,963,483 B2 | 11/2005 | Chakravorty et al. |
| 7,033,934 B2 * | 4/2006 | Iijima et al. .................. 438/667 |
| 7,138,295 B2 | 11/2006 | Leedy |
| 7,193,239 B2 | 3/2007 | Leedy |
| 7,474,004 B2 | 1/2009 | Leedy |
| 7,504,732 B2 | 3/2009 | Leedy |
| 7,705,466 B2 | 4/2010 | Leedy |
| 7,705,691 B2 * | 4/2010 | Lu et al. ......................... 333/12 |
| 2002/0085336 A1 | 7/2002 | Winer et al. |
| 2002/0132465 A1 | 9/2002 | Leedy |
| 2003/0173608 A1 | 9/2003 | Leedy |
| 2004/0089948 A1 * | 5/2004 | Cheng et al. .................. 257/758 |
| 2004/0108587 A1 * | 6/2004 | Chudzik et al. ............... 257/700 |
| 2005/0023664 A1 * | 2/2005 | Chudzik et al. ............... 257/678 |
| 2005/0106845 A1 | 5/2005 | Halahan et al. |
| 2005/0116275 A1 | 6/2005 | Lin et al. |
| 2006/0001174 A1 | 1/2006 | Matsui |
| 2008/0113505 A1 | 5/2008 | Sparks et al. |
| 2008/0128856 A1 | 6/2008 | Kwak |
| 2008/0173993 A1 * | 7/2008 | Andry et al. .................. 257/678 |
| 2008/0202799 A1 | 8/2008 | Graydon et al. |
| 2008/0296731 A1 | 12/2008 | Block et al. |
| 2009/0067210 A1 | 3/2009 | Leedy |
| 2009/0075478 A1 * | 3/2009 | Matsui .......................... 438/667 |
| 2009/0174082 A1 | 7/2009 | Leedy |
| 2009/0175104 A1 | 7/2009 | Leedy |
| 2009/0212438 A1 | 8/2009 | Kreupl et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2010/0308435 A1 * | 12/2010 | Nowak et al. ................. 257/532 |
| 2011/0037144 A1 * | 2/2011 | Chen et al. .................... 257/532 |

FOREIGN PATENT DOCUMENTS

| | | |
|---|---|---|
| CN | 98803836 | 6/2004 |
| EP | 0975472 | 4/1998 |
| EP | 1986233 | 4/1998 |
| JP | 1216591 | 8/1989 |
| JP | 3252193 | 11/1991 |
| JP | 10-543031 | 4/1998 |
| JP | 10163632 | 6/1998 |
| JP | 2000304744 A | 11/2000 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

* cited by examiner

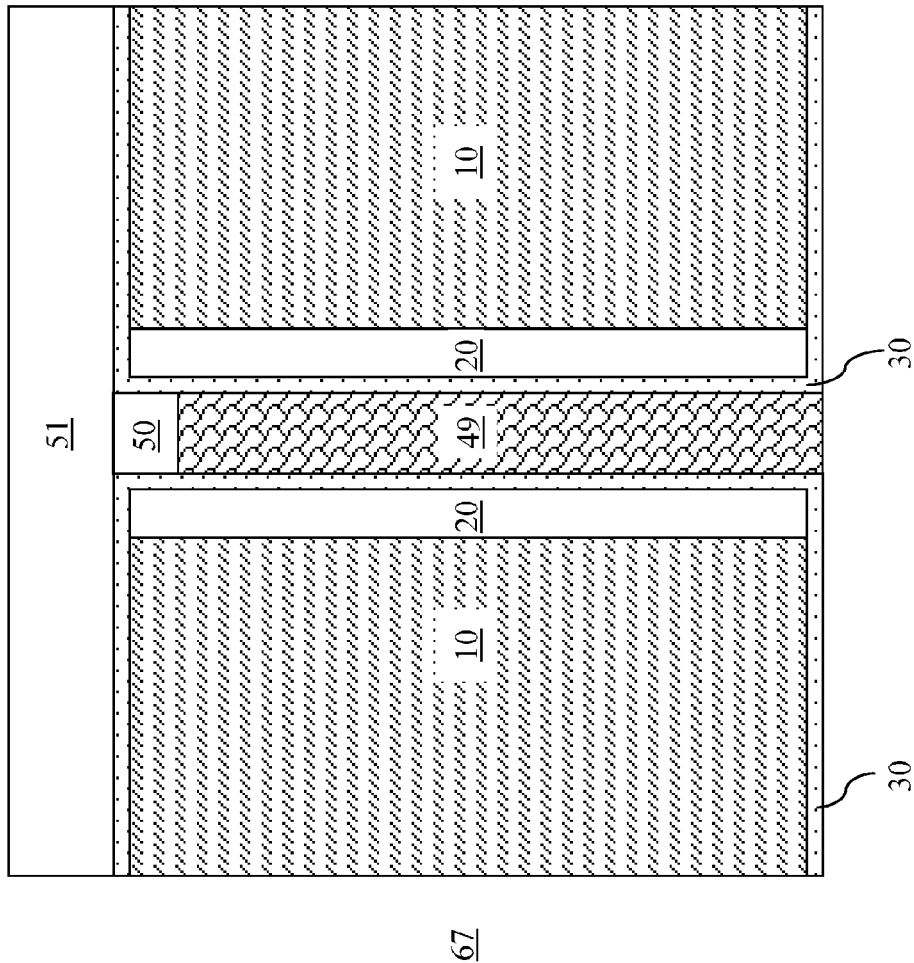
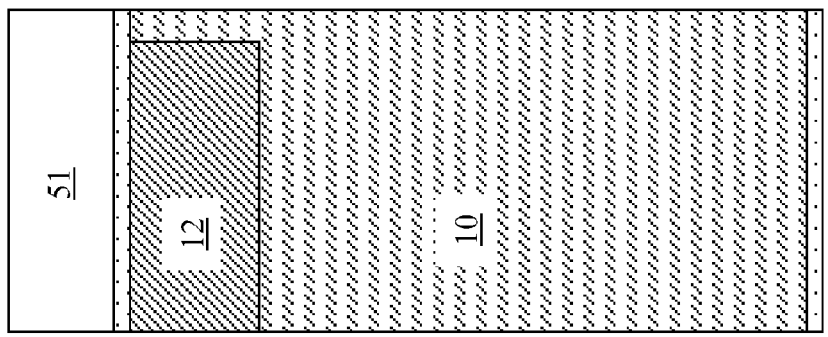
FIG. 9

INTEGRATED DECOUPLING CAPACITOR EMPLOYING CONDUCTIVE THROUGH-SUBSTRATE VIAS

CROSS REFERENCE TO RELATED APPLICATION

This application is a divisional of U.S. patent application Ser. No. 12/614,883, filed Nov. 9, 2009 the entire content and disclosure of which is incorporated herein by reference.

BACKGROUND

The present invention relates to the field of semiconductor structures, and particularly to a decoupling capacitor that employs a conductive through-substrate via and methods of manufacturing the same.

In resent years, "three dimensional silicon" (3DSi) structures have been proposed to enable joining of multiple silicon chips and/or wafers that are mounted on a package or a system board. The 3DSi structures increase the density of active circuits that are integrated in a given space.

As the circuit density increases unit area, the amount of switching activity per unit area also increases. This results in an increase in the noise generated on the reference supplies. As this noise increases, the performance of the internal devices as well as the performance of off-chip drivers is adversely impacted due to the reduction of noise margins available for the system design.

At present, this noise is controlled by embedding deep trench capacitors (DTC) within active silicon devices. To obtain sufficient degree of decoupling, a large array of DTC's are required. As the circuit density, switching activity, and power distribution structures are enhanced in a 3DSi structure, more DTC's will be required to control the noise generation. Further, as a number of DTC arrays are formed, there is an increase in the inductance between the active circuits and the arrays of DTC's, thereby requiring formation of additional DTC's to store the energy to be used to counter-balance a back electromagnetic force noise.

The voltage of the noise Vn is given by the following equation:

$$Vn = L \times (dI/dt),$$

in which L is inductance, I is current, and t is time. As the amount of inductance (L) increases, or as the speed at which the current changes (dI/dt), which is proportional to the switching speed of circuits, the noise Vn increases proportionally.

The above considerations show that capacitive structures having low inductive is needed to control inductively noise generated within and transmitted into a 3DSi structure.

BRIEF SUMMARY

According to an embodiment of the present invention, a capacitor in a semiconductor substrate employs a conductive through-substrate via (TSV) as an inner electrode and a columnar doped semiconductor region as an outer electrode. The capacitor provides a large decoupling capacitance in a small area, and does not impact circuit density or a Si3D structural design. Additional conductive TSV's can be provided in the semiconductor substrate to provide electrical connection for power supplies and signal transmission therethrough. The capacitor has a lower inductance than a conventional array of capacitors having comparable capacitance, thereby enabling reduction of high frequency noise in the power supply system of stacked semiconductor chips.

According to an aspect of the present invention, a semiconductor structure includes a semiconductor chip, which includes a semiconductor substrate; at least one capacitor embedded in the semiconductor substrate; and at least one laterally-insulated conductive through-substrate connection structure. Each of the at least one capacitor includes an inner electrode including a conductive through-substrate via (TSV) structure; a node dielectric laterally contacting and laterally enclosing the inner electrode; and an outer electrode laterally contacting and laterally enclosing a portion of the node dielectric.

According to another aspect of the present invention, a semiconductor structure includes a capacitor located in a semiconductor substrate and a contact structure located on the semiconductor substrate. The capacitor includes an inner electrode, a node dielectric, and an outer electrode. The inner electrode includes a conductive through-substrate via (TSV) structure that contiguously extends at least from an upper surface of the semiconductor substrate to a lower surface of the semiconductor substrate. The node dielectric laterally contacts and laterally encloses the inner electrode and contiguously extends from the upper surface to the lower surface. The outer electrode laterally contacts and laterally encloses a portion of the node dielectric. The contact structure is conductively connected to the outer electrode.

According to yet another aspect of the present invention, a method of forming a semiconductor structure is provided. The method includes forming a capacitor and a laterally-insulated conductive through-substrate connection structure in a semiconductor substrate. The laterally-insulated conductive through-substrate connection structure is formed by forming a dielectric tubular structure around a first through-substrate cavity formed in the semiconductor substrate; and filling a cavity within the dielectric tubular structure with a conductive material. The capacitor is formed by forming an outer electrode by doping a portion of the semiconductor substrate around a second through-substrate cavity; forming a node dielectric on a surface of the second through-substrate cavity; and forming an inner electrode by filling the second through-substrate cavity with the conductive material.

According to still another aspect of the present invention, a method of forming a semiconductor structure is provided. The method includes providing a semiconductor chip and electrically connecting the semiconductor chip to a mounting structure employing an array of solder balls. The semiconductor chip includes a semiconductor substrate; at least one capacitor embedded in the semiconductor substrate; and at least one laterally-insulated conductive through-substrate connection structure. The at least one capacitor has an inner electrode that includes a conductive through-substrate via (TSV) structure.

BRIEF DESCRIPTION OF THE SEVERAL VIEWS OF THE DRAWINGS

FIGS. 1-18 are sequential vertical cross-sectional views through various processing steps of a first exemplary structure according to a first embodiment of the present invention.

DETAILED DESCRIPTION

Figure 1:
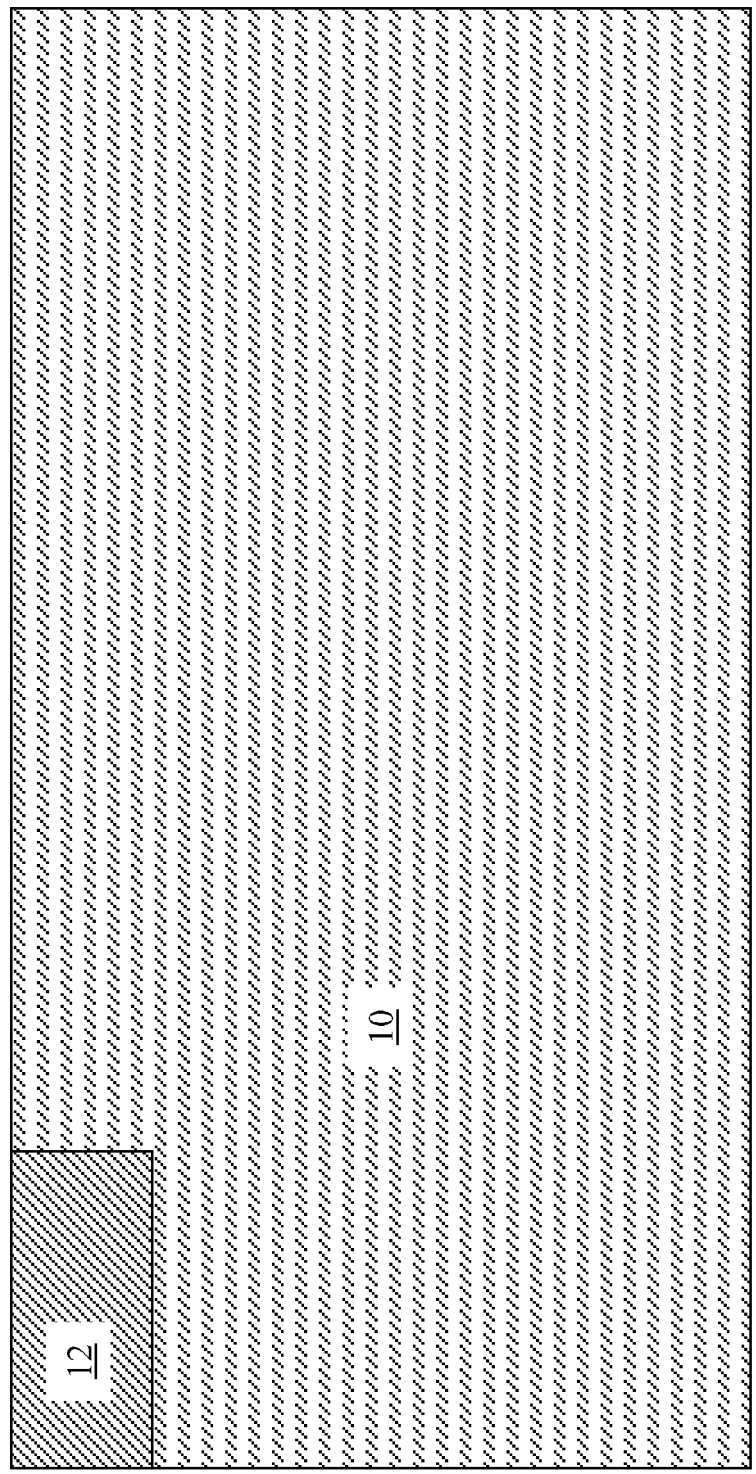

As stated above, the present invention relates to semiconductor structures, and particularly to a decoupling capacitor that employs a conductive through-substrate via and methods of manufacturing the same, which are now described in detail with accompanying figures. Throughout the drawings, the same reference numerals or letters are used to designate like or equivalent elements. The drawings are not necessarily drawn to scale.

As used herein, a "conductive through-substrate via (TSV) structure" is a conductive structure that extends through a substrate, i.e., at least from a top surface of the substrate to a bottom surface of the substrate.

As used herein, a "laterally-insulated conductive through-substrate connection structure" is an assembly of a conductive TSV structure and another structure that laterally surrounds the conductive TSV structure and electrically isolates the conductive TSV structure from the substrate.

As used herein, a "mounting structure" is any structure to which a semiconductor chip can be mounded by making electrical connections thereto. A mounting structure can be a packaging substrate, an interposer structure, or another semiconductor chip.

As used herein, a first element "laterally contacts" a second element if there is a direct physical contact between the first element and the second element in a "lateral direction," which is any direction perpendicular to a top surface or a bottom surface of a substrate.

As used herein, a first element "laterally encloses" a second element if an inner periphery of the first element is located on or outside an outer periphery of the second element.

As used herein, a first element "encapsulates" a second element if all outer surfaces of the second element are located within inner surfaces of the first element.

As used herein, two elements are "conductively connected" to each other if there exists a conductive path between the two elements to allow conduction of electricity.

Referring to FIG. 1, a first exemplary structure according to a first embodiment of the present invention includes a semiconductor substrate 10 that has a semiconductor material. The semiconductor material of the semiconductor substrate 10 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor material of the semiconductor substrate 10 is a single crystalline material. For example, the semiconductor substrate 10 can be a single crystalline silicon layer. The semiconductor substrate 10 can be doped with dopants of a first conductivity type, which can be p-type or n-type. The dopant concentration of the semiconductor substrate 10 can be from $1.0\times10^{14}/cm^3$ to $1.0\times10^{17}/cm^3$.

A doped well region 12 is formed in the semiconductor substrate 12 by implanting dopants of a second conductivity through a portion of the top surface of the semiconductor substrate 12. The second conductivity type is the opposite of the first conductivity type. The second conductivity type is n-type if the first conductivity type is p-type, and vice versa. The dopant concentration of the doped well region 12 can be from $1.0\times10^{18}/cm^3$ to $1.0\times10^{21}/cm^3$ to increase the conductivity of the doped well region 12.

Figure 2:
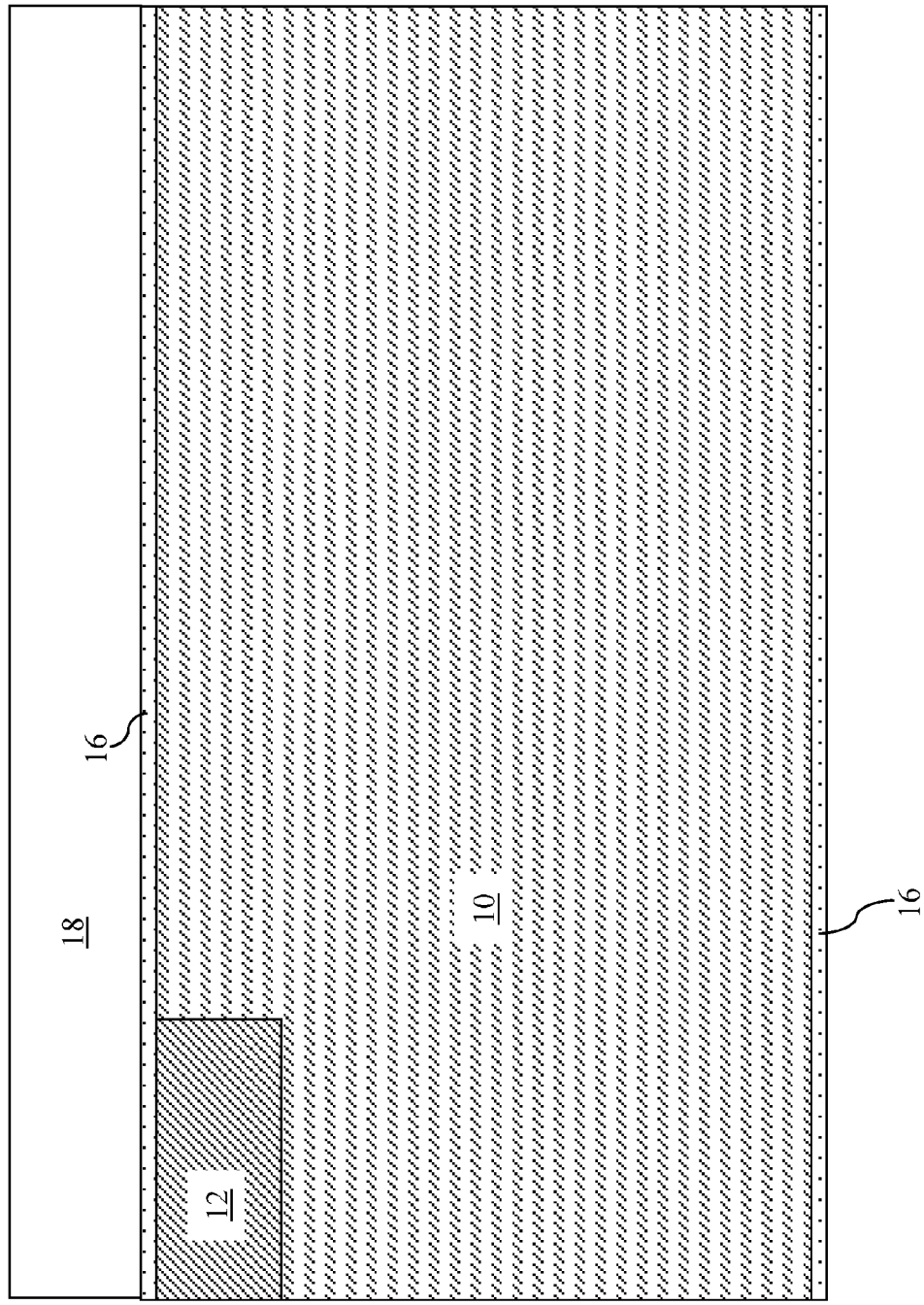

Referring to FIG. 2, a pad dielectric layer 16 and a first mask layer 18 are formed on the top surface of the semiconductor substrate 10. The pad dielectric layer 16 may, or may not, be formed on the backside of the semiconductor substrate 10. The pad dielectric layer 16 includes a dielectric material such as silicon nitride. The first mask layer 18 can be composed of a photoresist or a dielectric material such as silicon oxide or silicon nitride.

Figure 3:
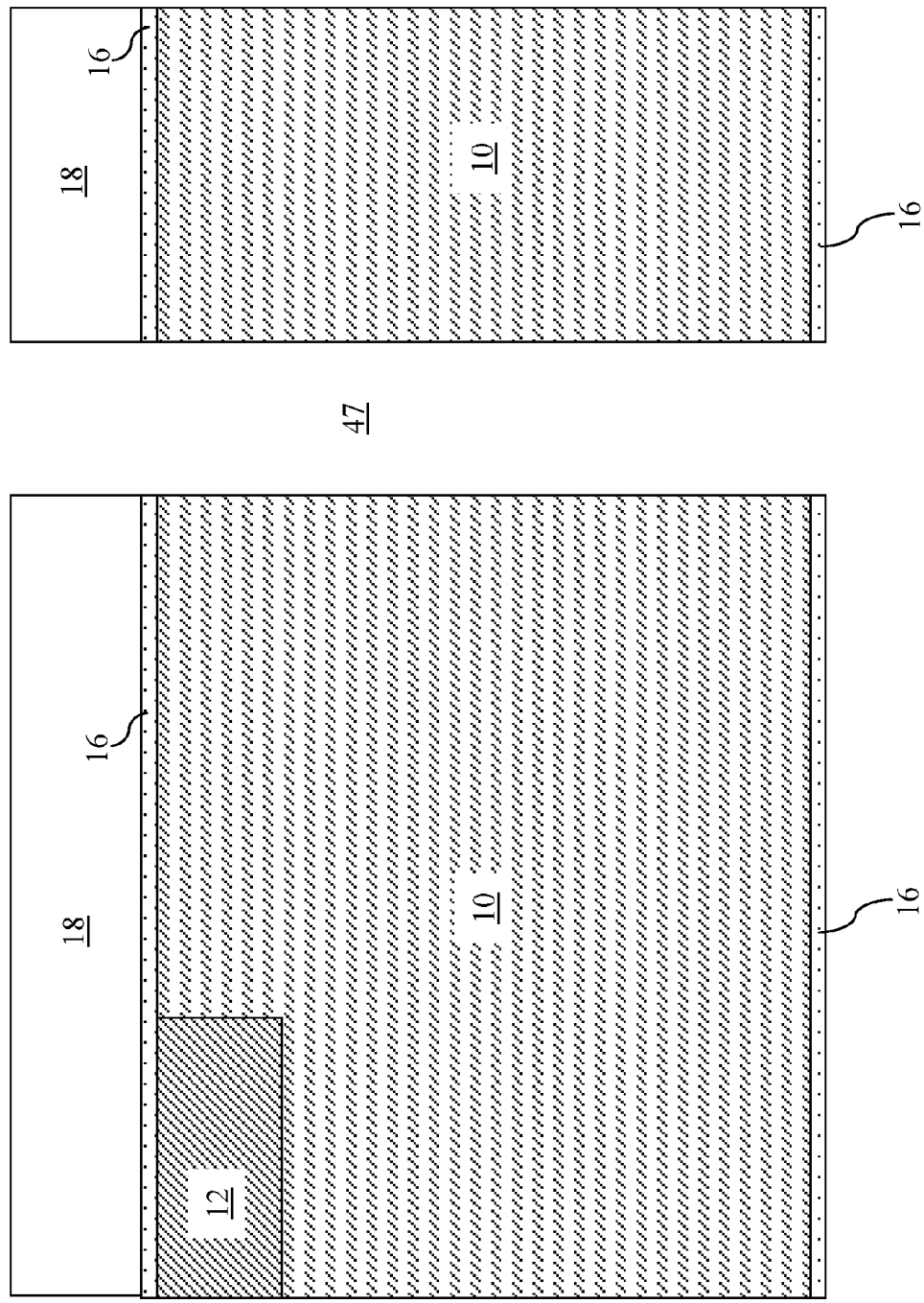

Referring for FIG. 3, the first mask layer 18 is lithographically patterned, and the pattern in the first mask layer 18 is transferred through the semiconductor substrate 10 by an anisotropic etch that employs the first mask layer 18 as an etch mask. A first through-substrate cavity 47 is formed in the semiconductor substrate 10. The lateral dimensions, e.g., diameter, a major axis, a minor axis, a length of a side, of the first through-substrate cavity 47 can be from 1 micron to 100 microns, and typically from 3 microns to 30 microns, although lesser and greater lateral dimensions can also be employed.

Figure 4:
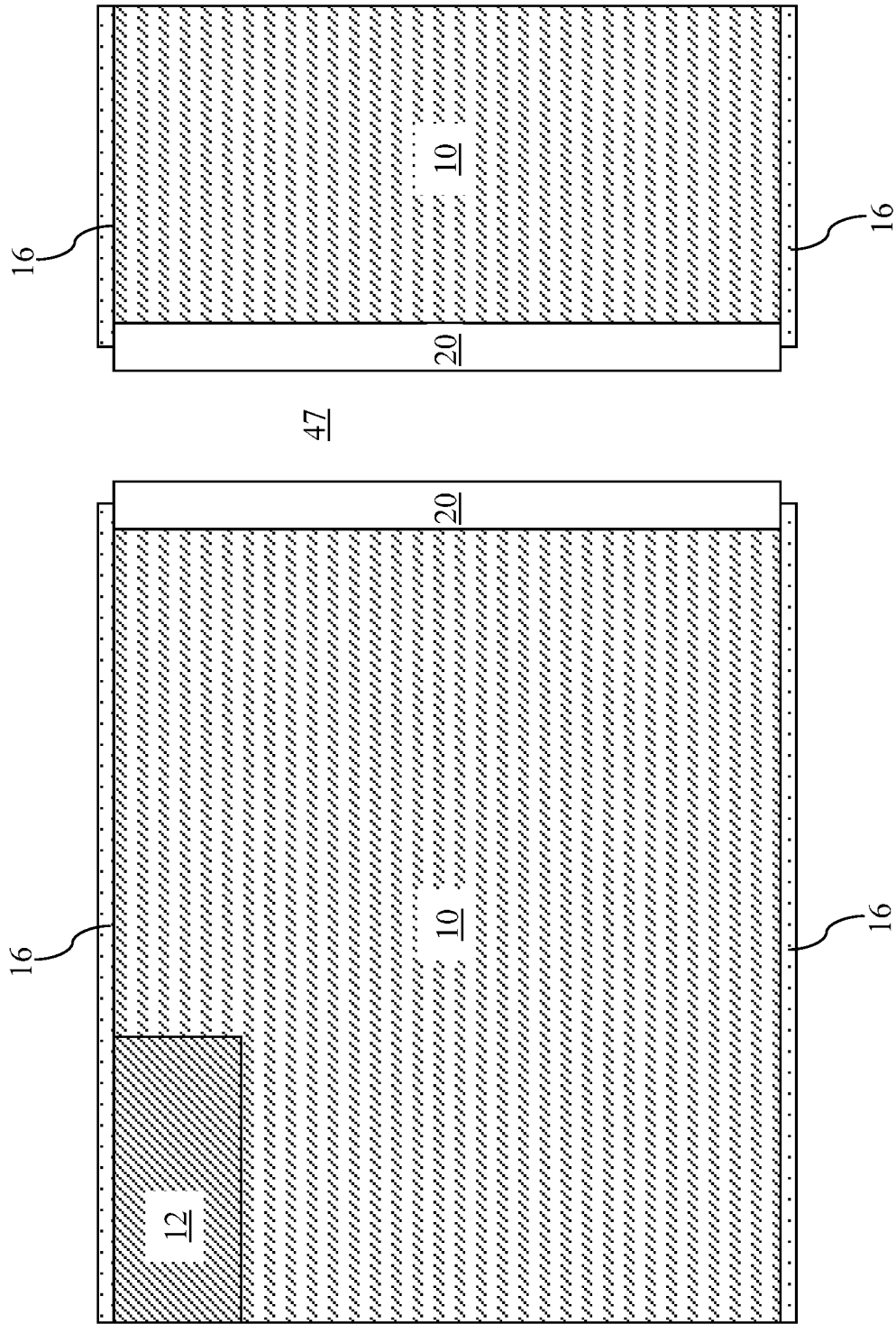

Referring to FIG. 4, the first mask layer 18 can be removed selective to the semiconductor substrate 10. A dielectric tubular structure 20 is formed around the first through-substrate cavity 47, for example, by converting exposed portions of the semiconductor substrate 10 on the sidewalls of the first through-substrate cavity 47 into a dielectric material. For example, the exposed portion of the semiconductor substrate can be converted into a dielectric oxide by thermal oxidation. The dielectric tubular structure 20 can include an oxide of the semiconductor material of the semiconductor substrate 10. For example, if the semiconductor substrate 10 includes silicon, the dielectric tubular structure 20 can include silicon oxide. The pad dielectric layer 16 prevents conversion of other portions of the semiconductor substrate 10 into a dielectric material. The dielectric tubular structure 20 extends from the top surface of the semiconductor substrate 10 to the bottom surface of the semiconductor substrate 10. A horizontal cross-sectional area of the dielectric tubular structure 20 includes a hole corresponding to the first through-substrate cavity 47. The thickness of the dielectric tubular structure 20, as measured laterally between an inner periphery of the dielectric tubular structure 20 and an outer periphery of the dielectric tubular structure 20 can be from 100 nm to 1 micron, although lesser and greater thicknesses can also be employed.

Figure 5:
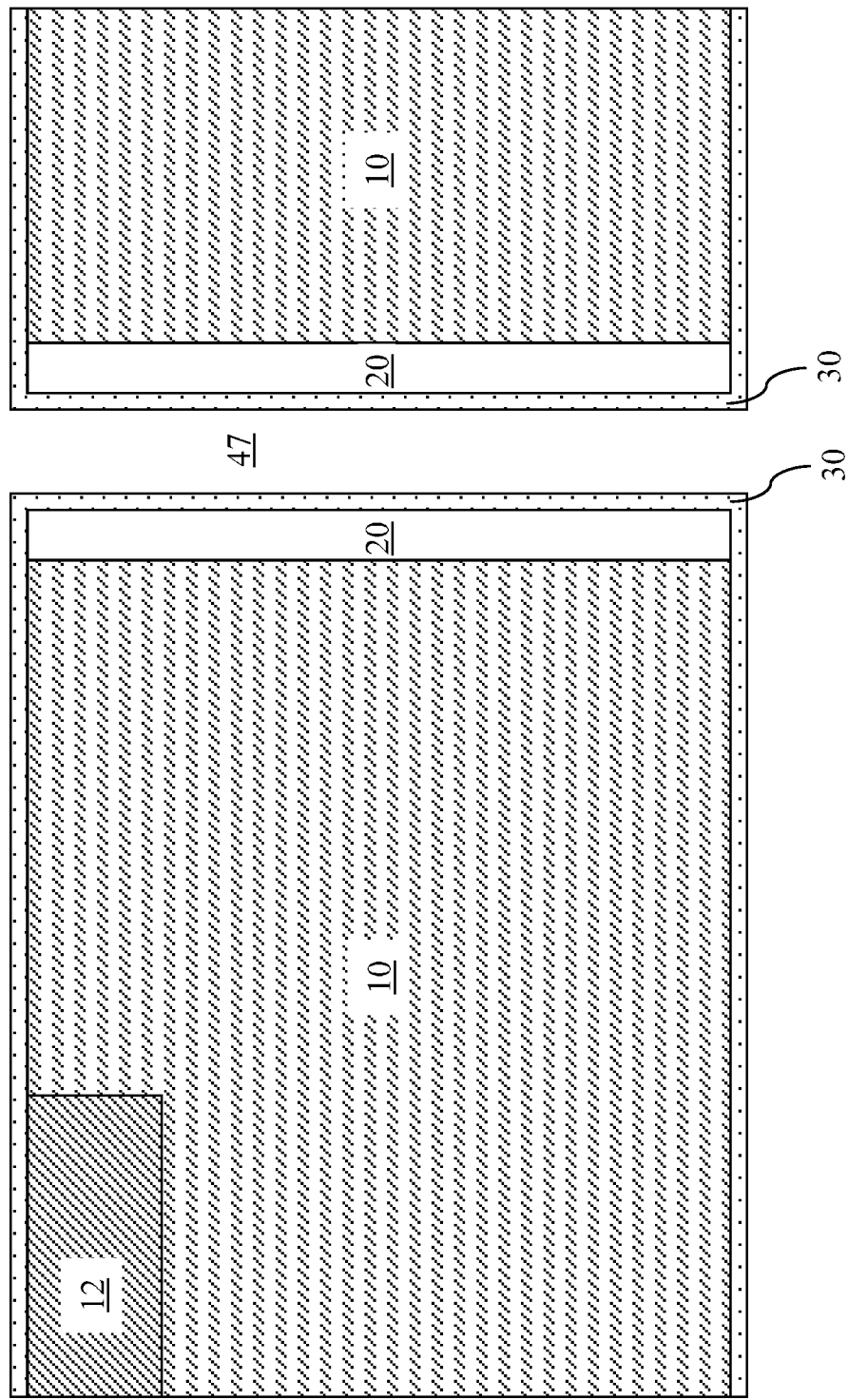

Referring to FIG. 5, the pad dielectric layer 16 can be removed. Optionally, a dielectric liner 30 is deposed on the inner sidewalls of the dielectric tubular structure 20. The dielectric liner 30 can include, for example, a stack of a silicon oxide layer and a silicon nitride layer.

Figure 6:
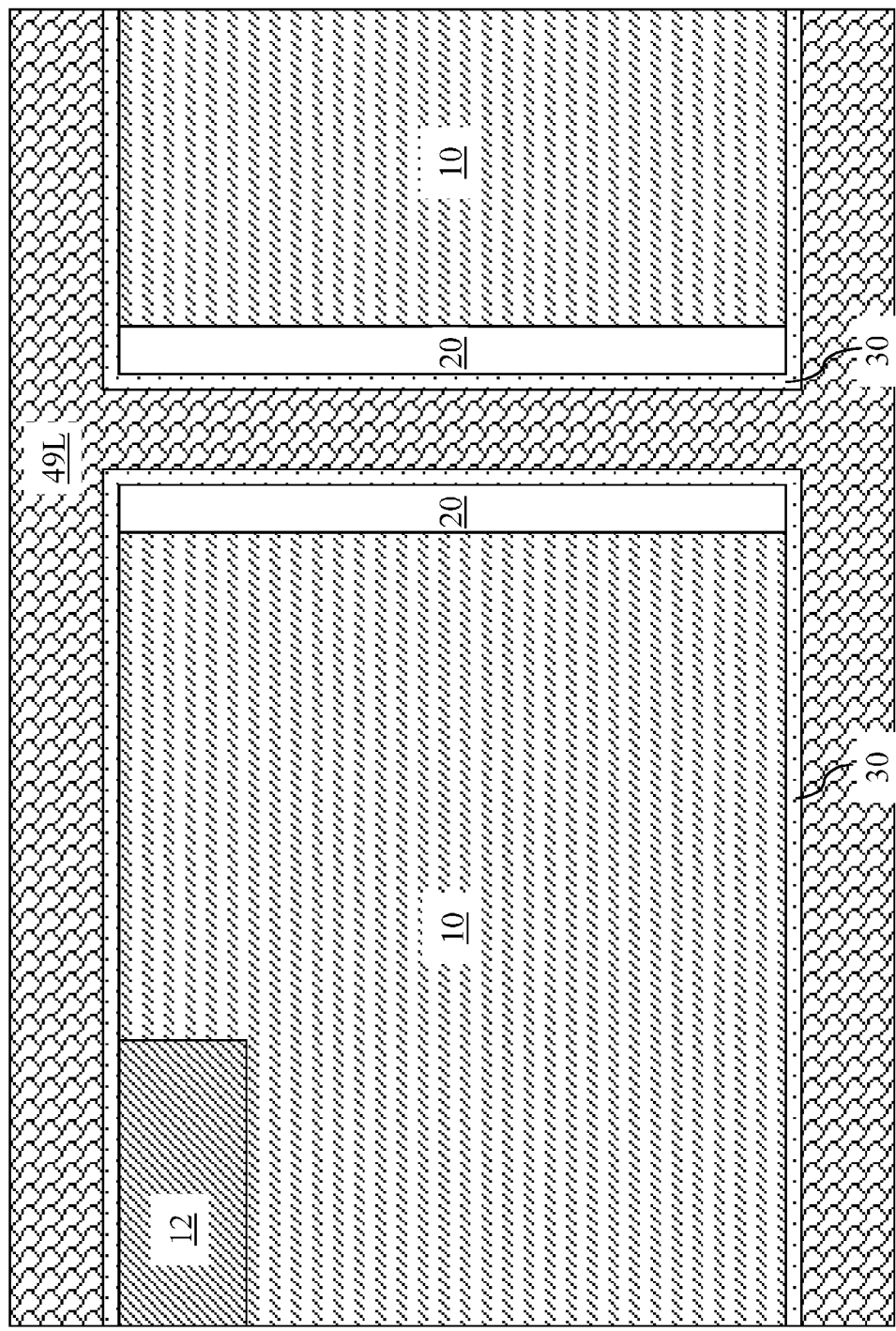

Referring to FIG. 6, the first through-substrate cavity 47 is filled with a first disposable material to form a first disposable material layer 49L. The first disposable material layer 49L extends through the semiconductor substrate 10 and covers both sides of the semiconductor substrate 10, thereby encapsulating the semiconductor substrate 10. The first disposable material can be, for example, a polycrystalline silicon-containing material such as polysilicon or an amorphous silicon-containing material such as amorphous silicon.

Figure 7:
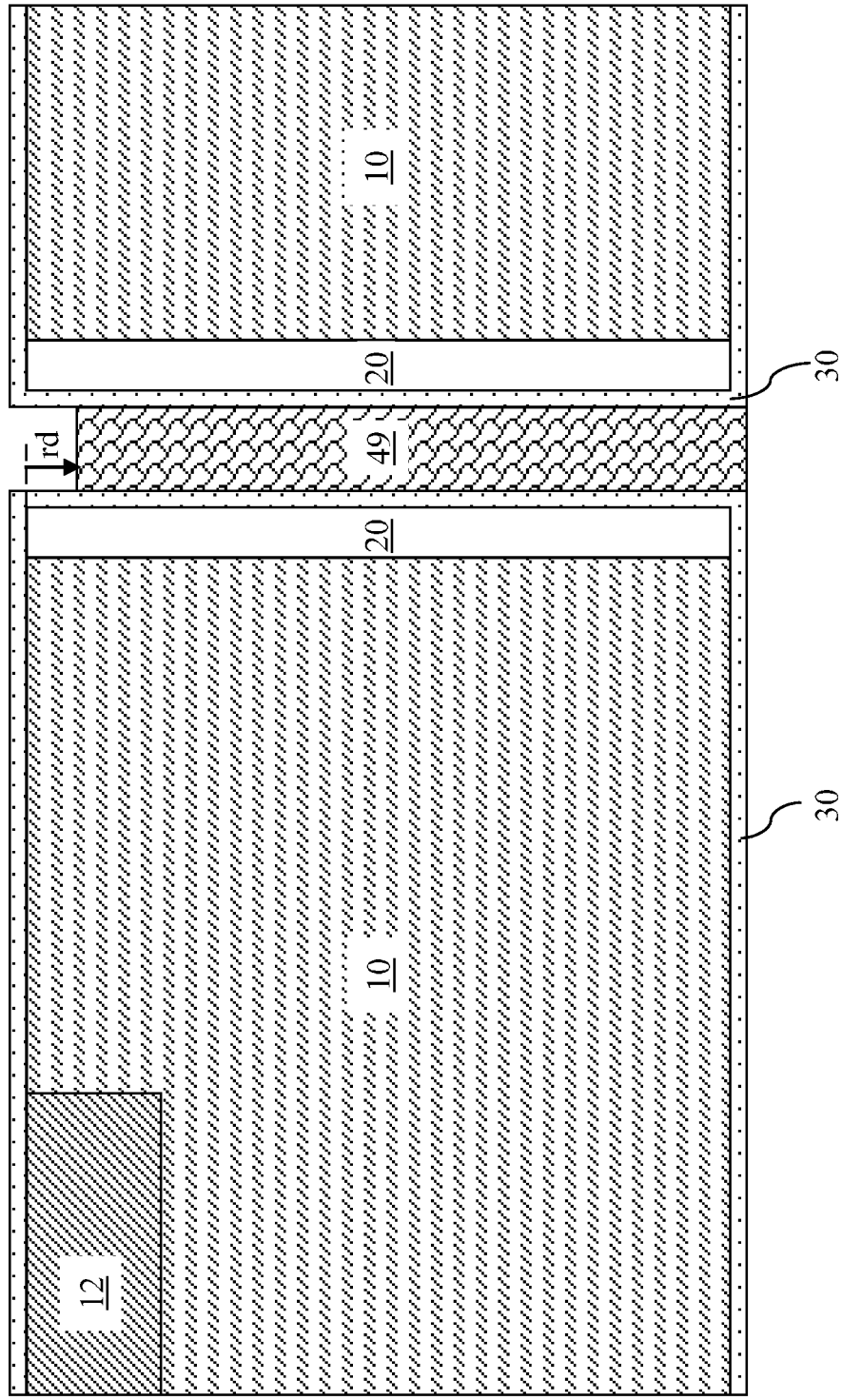

Referring to FIG. 7, the first disposable material layer 49L is removed from the front side and the backside of the semiconductor substrate 10, for example, by an etch-back process or chemical mechanical planarization (CMP). Further, a portion of the first disposable material layer 49L is recessed below the top surface of the semiconductor substrate 10 by a recess depth rd, which can be from 200 nm to 2,000 nm, although lesser and greater recess depths rd can also be employed. The remaining portion of the first disposable material layer 49L constitutes a first disposable material portion 49.

Figure 8:
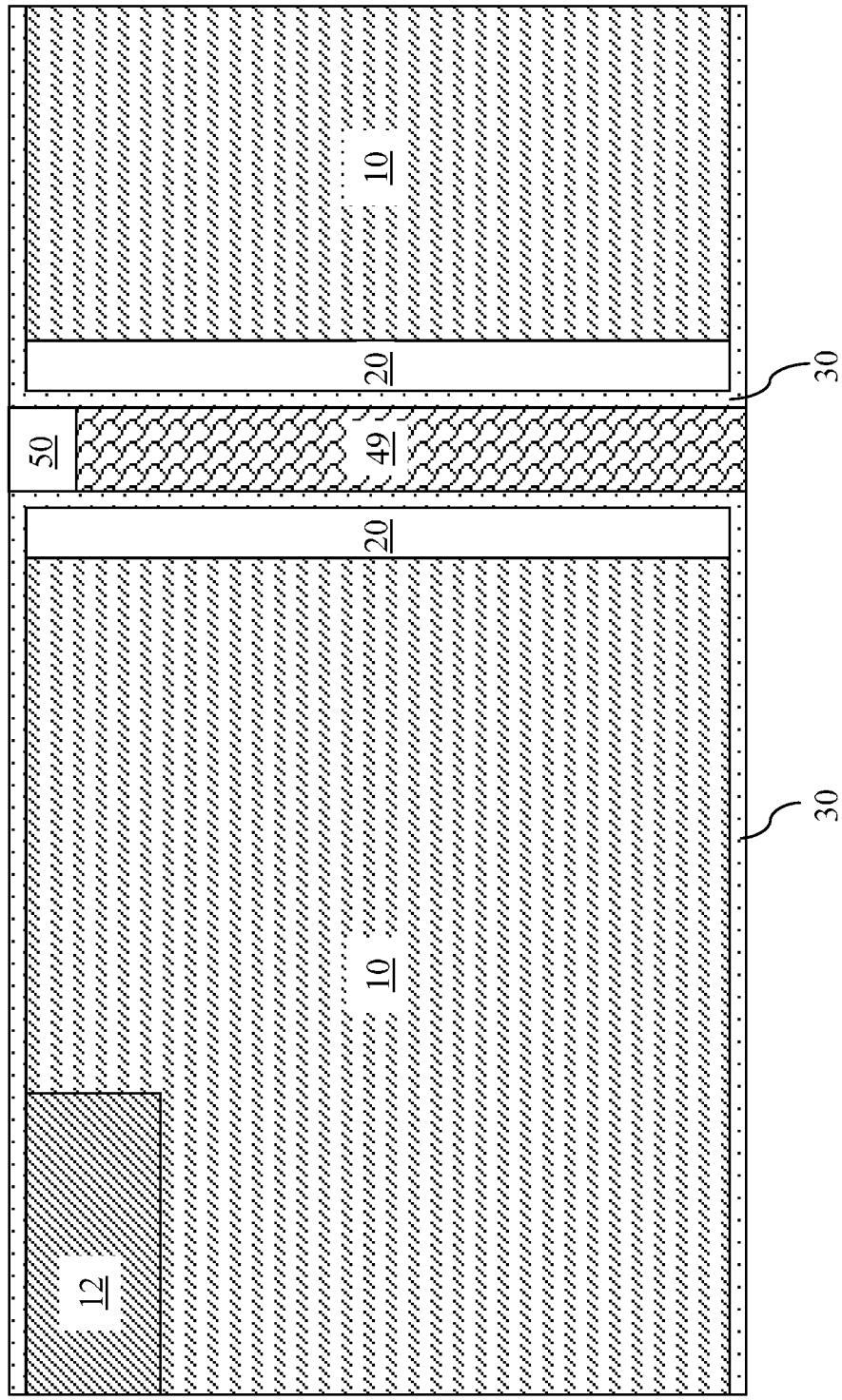

Referring to FIG. 8, a dielectric cap portion 50 is formed by filling a cavity above the first disposable material portion 49 with a dielectric material and removing excess dielectric material above a top surface of the dielectric liner 30. Optionally, a silicon nitride cap layer (not shown) can be deposited on the top surface of the dielectric cap portion 50 and the portion of the dielectric liner 30 located on the front side of the semiconductor substrate 10.

Referring to FIG. 9, a second mask layer 51 is formed above the top surface of the semiconductor substrate 10. The second mask layer 51 can be composed of a photoresist or a dielectric material such as silicon oxide or silicon nitride. The second mask layer 51 is lithographically patterned to form an opening in an area that does not overlie the disposable material portion 49 or the dielectric tubular structure 20. The opening in the second mask layer 51 is formed over or in proximity to the doped well region 12. The pattern in the second mask layer 51 is transferred through the semiconductor substrate 10 by an anisotropic etch that employs the second mask layer 51 as an etch mask. A second through-substrate cavity 67 is formed in the semiconductor substrate 10. The lateral dimensions, e.g., diameter, a major axis, a minor axis, a length of a side, of the second through-substrate cavity 67 can be from 1 micron to 100 microns, and typically from 3 microns to 30 microns, although lesser and greater lateral dimensions can also be employed.

Figure 10:
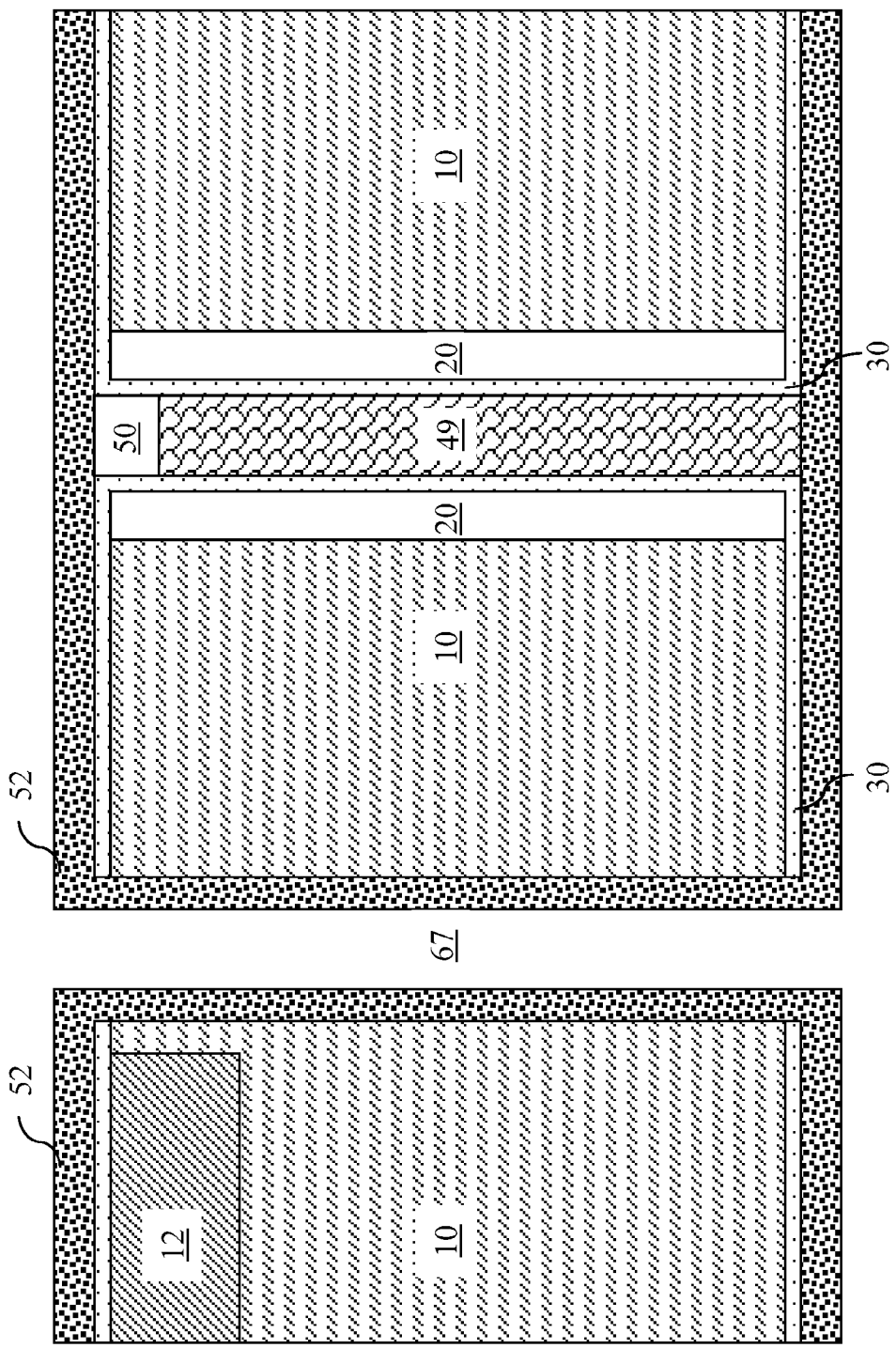

Referring to FIG. 10, a doped material layer 52 is deposited on the exposed surfaces of the first exemplary structure including the sidewalls of the second through-substrate cavity 67. The doped material layer 52 includes dopants of the second conductivity type. The doped material layer 52 can be, for example, an arsenosilicate glass (ASG) layer. The thickness of the doped material layer 52 is less than half of the smallest lateral dimension of the second through-substrate cavity 67 to prevent plugging of the second through-substrate cavity 67. Optionally, a dielectric capping layer (not shown) may be deposited over the doped material layer 52 to prevent loss of dopants during a subsequent drive-in anneal.

Figure 11:
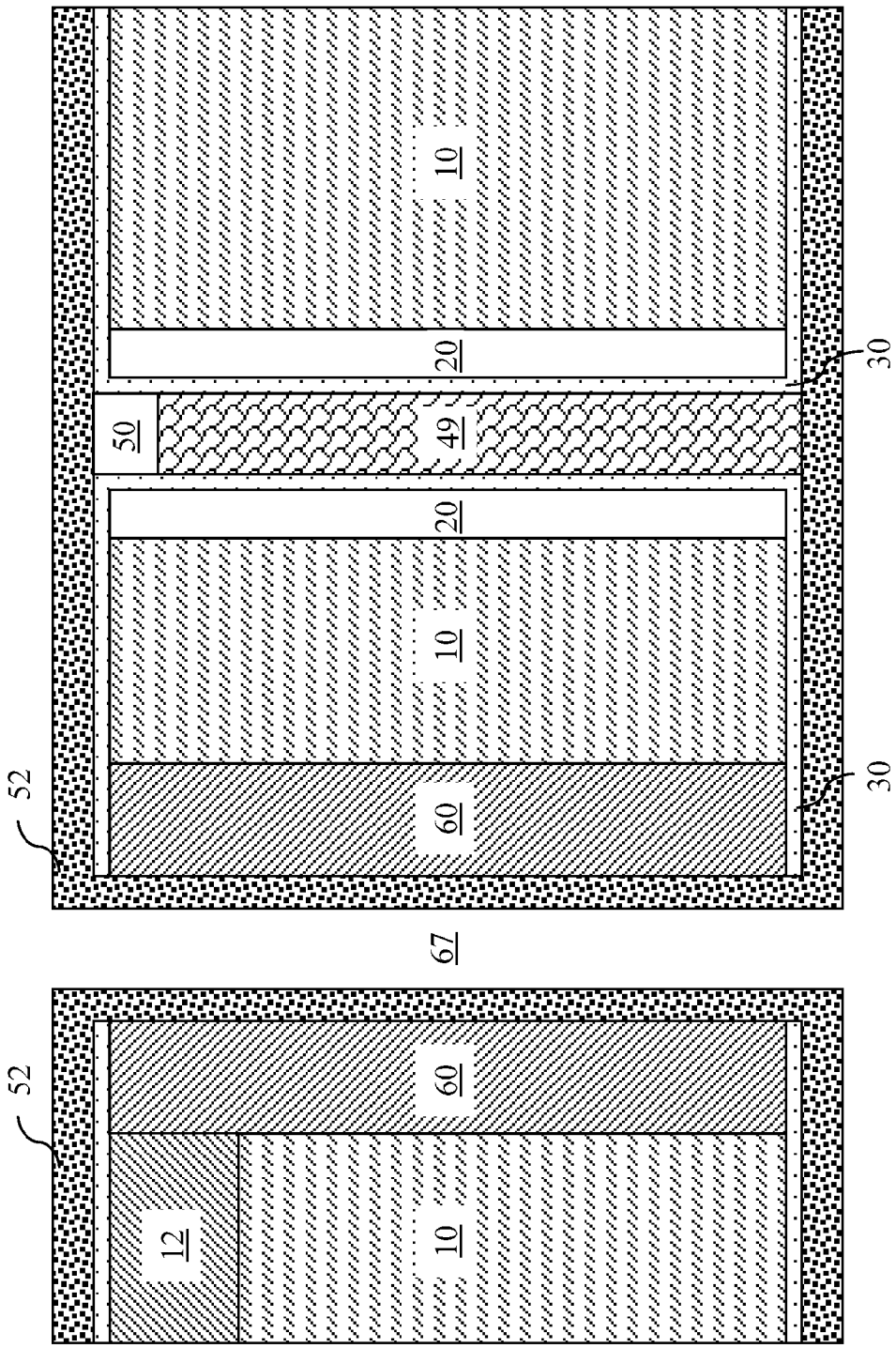

Referring to FIG. 11, a drive-in anneal is performed to induce outdiffusion of dopants of the second conductivity type into a region of the semiconductor substrate 10 that surrounds the second through-substrate cavity 67. An outer electrode is formed by doping a portion of the semiconductor substrate 10 around the second through-substrate cavity 67. Specifically, the outer electrode 60 is formed by converting a tubular region, i.e., a region in the shape of a tube, into a doped semiconductor region having a doping of the second conductivity type. For example, a dopant-containing material layer such as an arsenosilicate glass layer can be deposited on sidewalls of the second through-substrate cavity 67 and the dopants can be driven into the semiconductor substrate 10 by a drive-in anneal. The outer electrode 60 is a doped tubular portion including a doped semiconductor material, i.e., has a shape of a tube. The lateral distance between the outer periphery of the outer electrode 60 and the inner periphery of the outer electrode, i.e., the boundary with the doped material layer 52, can be from 150 nm to 1,000 nm, although a lesser and greater lateral distances can also be employed. The dopant concentration of the outer electrode 60 can be from $1.0 \times 10^{18}/cm^3$ to $1.0 \times 10^{20}/cm^3$, although a lesser and greater dopant concentration can also be employed. The doped material layer 52 is subsequently removed. In an alternate embodiment, the outer electrode 60 can be formed by plasma doping without employing a doped material layer 52.

Figure 12:
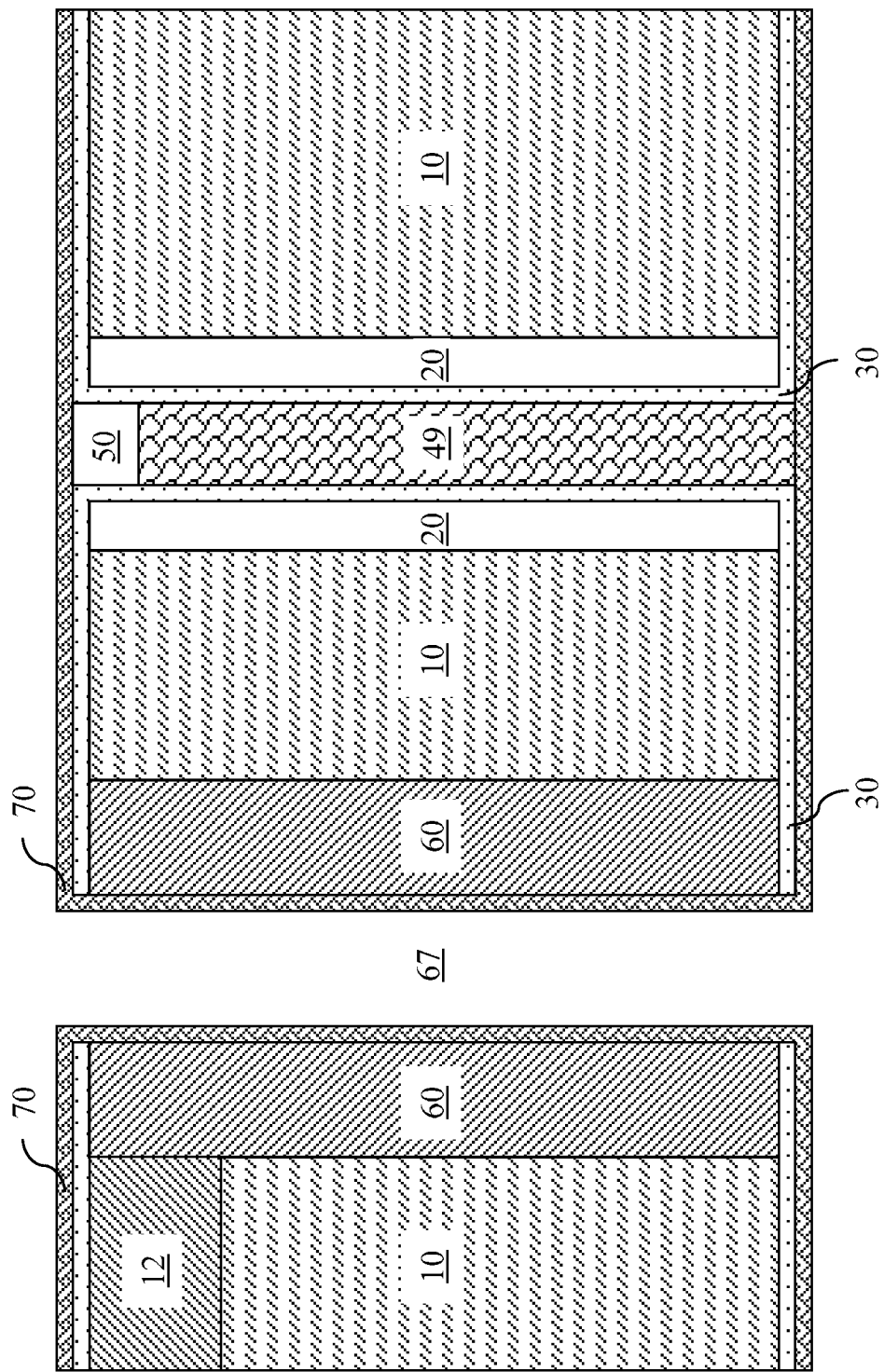

Referring to FIG. 12, a node dielectric 70 is formed on all exposed surfaces of the first exemplary structure including the inner sidewalls of the outer electrode 60, which are the surfaces of the second through-substrate cavity 67, and exposed surfaces of the dielectric liner 30. The node dielectric 70 is formed directly on sidewalls of the doped tubular portion while the disposable material is present in the semiconductor substrate. The thickness of the node dielectric 70 can be from 3 nm to 30 nm, although lesser and greater thicknesses can also be employed.

Figure 13:
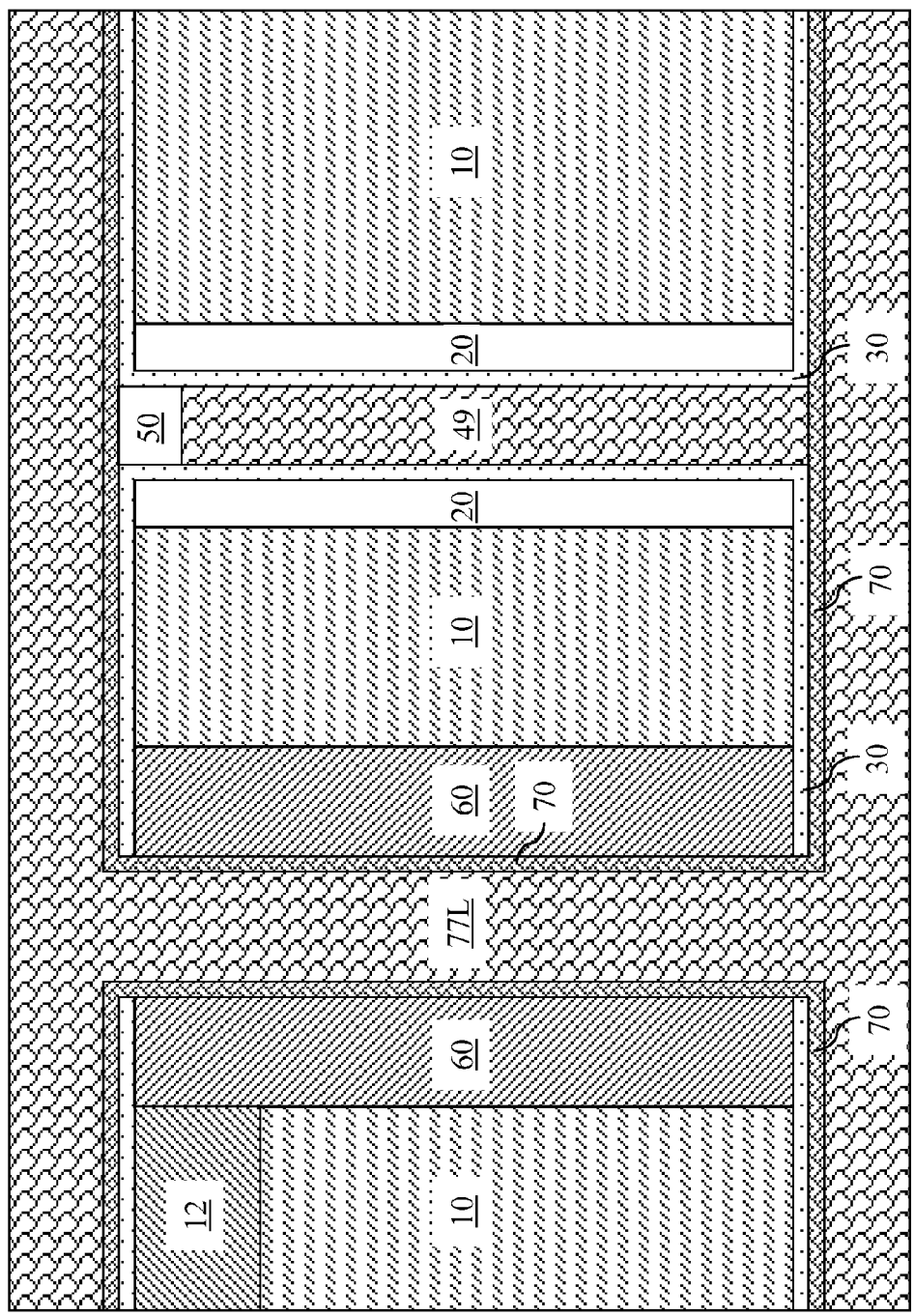

Referring to FIG. 13, the second through-substrate cavity 67 is filled with a second disposable material to form a second disposable material layer 77L. The second disposable material layer 77L extends through the semiconductor substrate 10 and covers both sides of the semiconductor substrate 10, thereby encapsulating the semiconductor substrate 10. The second disposable material can be, for example, a polycrystalline silicon-containing material such as polysilicon or an amorphous silicon-containing material such as amorphous silicon.

Figure 14:
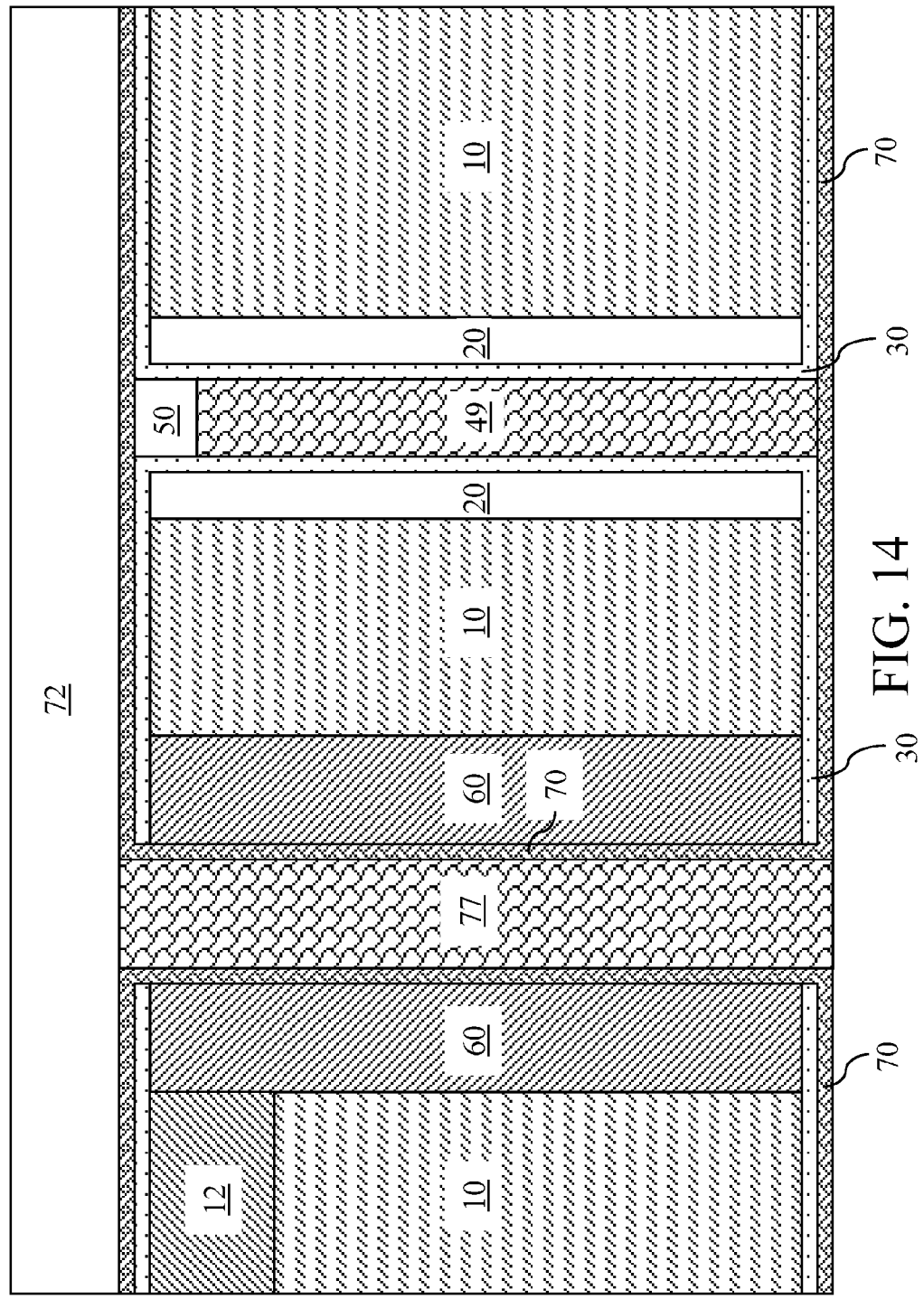

Referring to FIG. 14, the second disposable material layer 77L is removed from the front side and the backside of the semiconductor substrate 10, for example, by an etch-back process or chemical mechanical planarization (CMP). The remaining portion of the second disposable material layer 77L constitutes a second disposable material portion 77. The top surface of the second disposable material portion 77 can be coplanar with a top surface of the node dielectric 70 on the front side of the semiconductor substrate 20.

A hard mask layer 72 is formed on one side of the semiconductor substrate 20, which is preferably the front side of the semiconductor substrate on which the dielectric cap portion 50 is located. The hard mask layer 72 includes a dielectric material such as silicon oxide, silicon nitride, a doped silicate glass, or a combination thereof. The thickness of the hard mask layer 72 can be from 500 nm to 5,000 nm, and typically from 1,000 nm to 3,000 nm, although lesser and greater thicknesses can also be employed.

Figure 15:
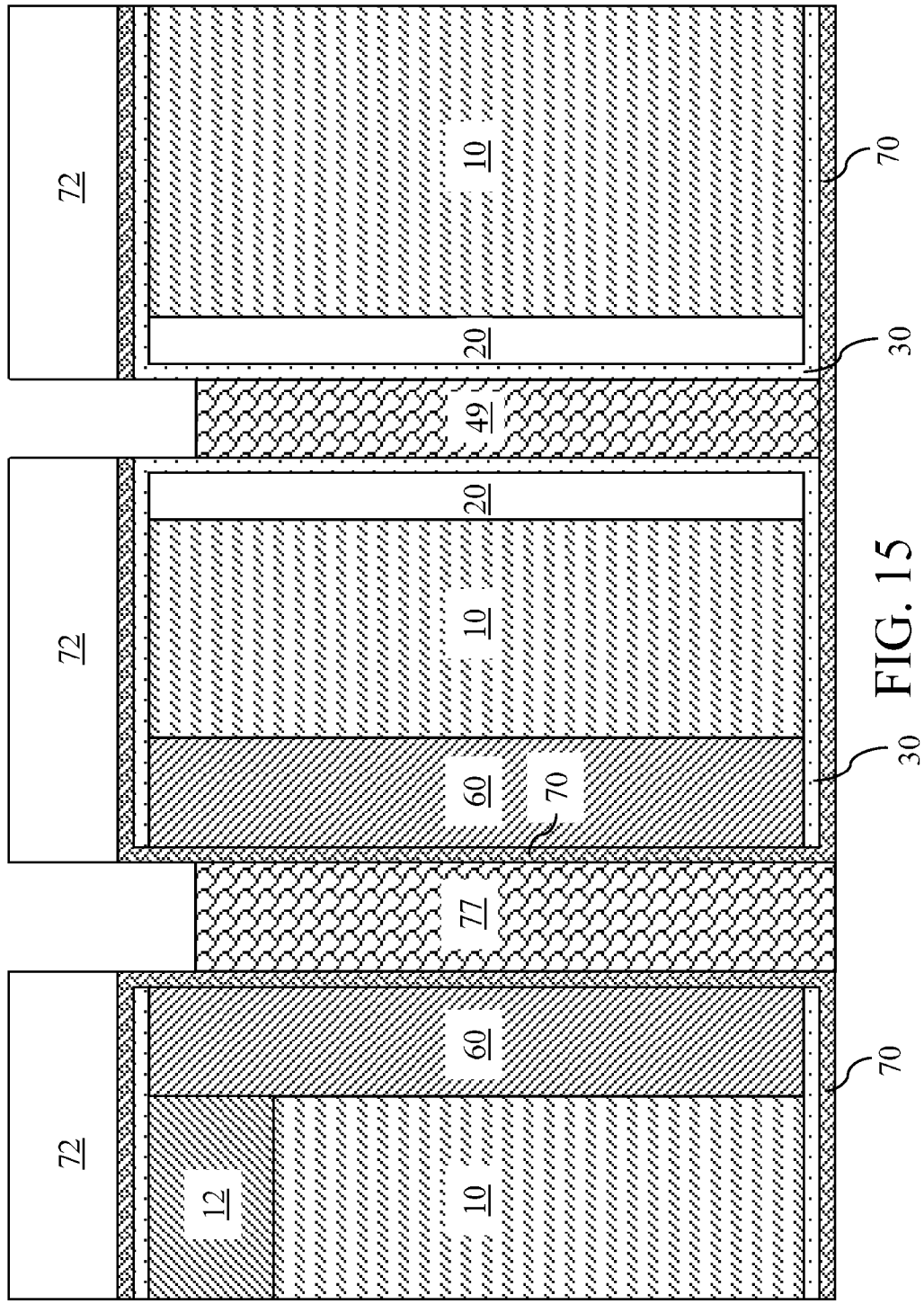

Referring to FIG. 15, the hard mask layer 72 is lithographically patterned to form openings over the second disposable material portion 77 and the first disposable material portion 49. The dielectric cap portion 50 is removed to expose an upper surface of the first disposable material portion 49. An upper portion of the second disposable material portion 77 can be removed during the removal of the dielectric cap portion 50.

Figure 16:
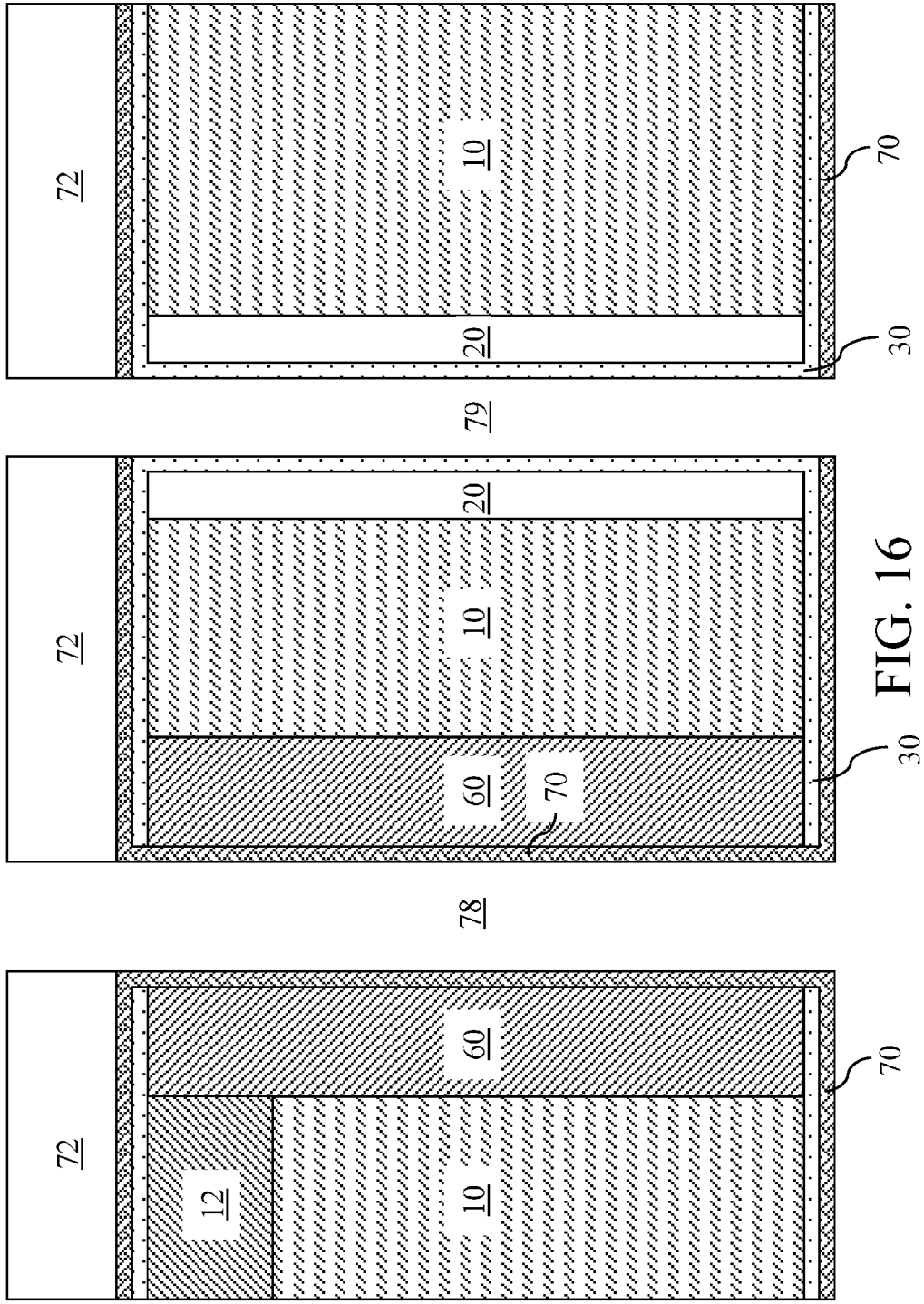

Referring to FIG. 16, the first dielectric material of the first disposable material portion 49 and the second dielectric material of the second dielectric material portion 77 are removed by an etch that employs the hard mask layer 72 as an etch mask. Removal of the first disposable material portion 49 forms a cavity in a volume corresponding to the first through-substrate cavity 47 in prior processing steps. This cavity is herein referred to as a re-formed first through-substrate cavity 79, i.e., a first through-substrate cavity that is formed a second time Likewise, removal of the second disposable material portion 77 forms a cavity in a volume corresponding to the second through-substrate cavity 67 in prior processing steps. This cavity is herein referred to as a re-formed second through-substrate cavity 78, i.e., a second through-substrate cavity that is formed a second time. The re-formed first through-substrate cavity 79 is formed within the dielectric tubular structure 20. Surfaces of the node dielectric 70 is exposed around the re-formed second through-substrate cavity 78, and surfaces of the dielectric liner 30 can be exposed around the re-formed first through-substrate cavity 79. If the dielectric liner 30 is not present, inner surfaces of the dielectric tubular structure 20 can be exposed in the re-formed first through-substrate cavity 79.

Figure 17:
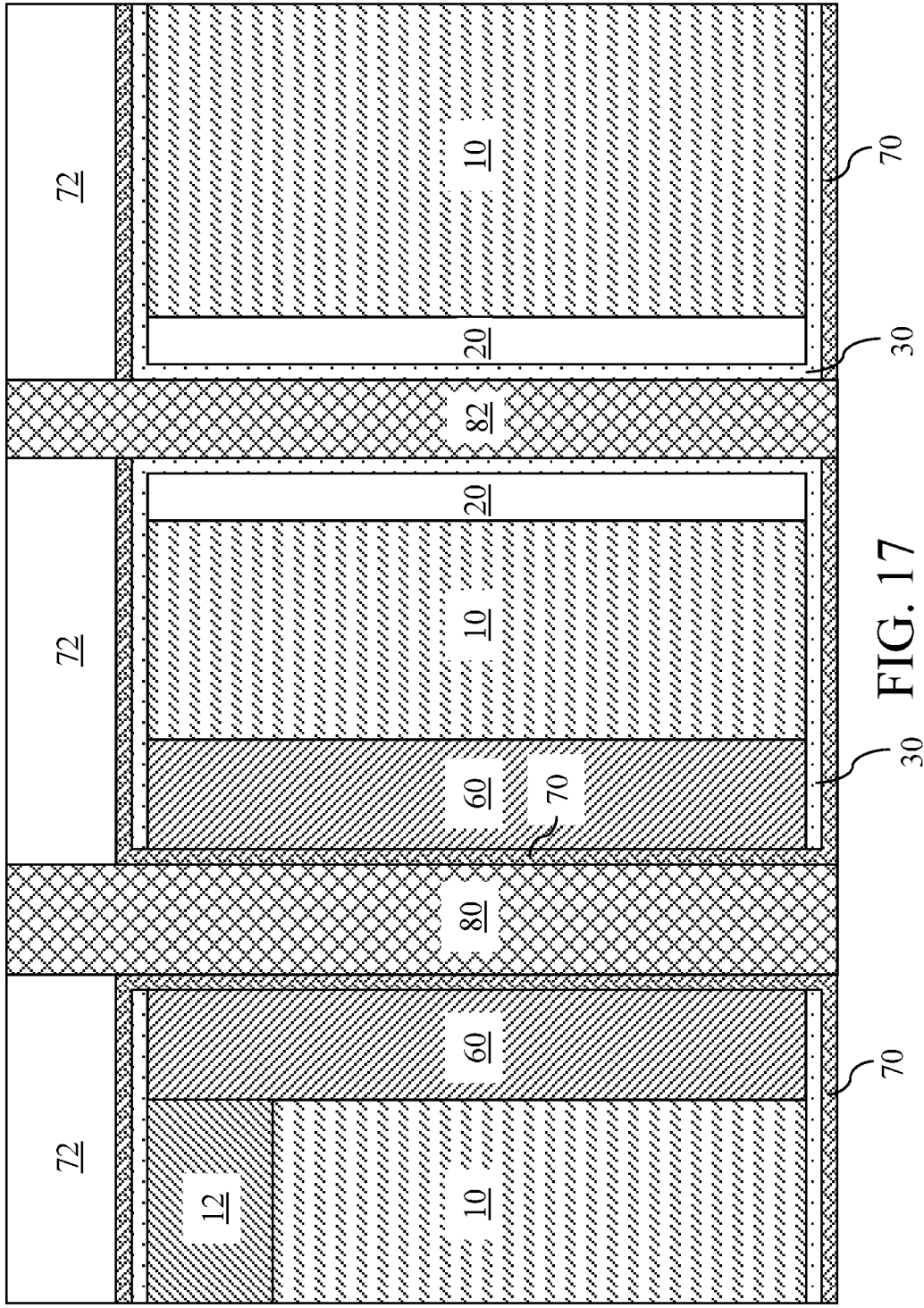

Referring to FIG. 17, the re-formed first through-substrate cavity 79 and the re-formed second through-substrate cavity 78 are filled with a conductive material to form a first conductive through-substrate via (TSV) structure 80 and a second conductive TSV structure 82, respectively. The conductive material of the first conductive TSV structure 80 and the second conductive TSV structure 82 can include a doped semiconductor material, a metallic material, or a combination thereof. The conductive material of the first conductive TSV structure 80 and the second conductive TSV structure 82 can include, but is not limited to, doped polysilicon, a doped silicon-containing alloy, Cu, W, Ta, Ti, WN, TaN, TiN, or a combination thereof. The conductive material can be deposited, for example, by electroplating, electroless plating, physical vapor deposition (PVD), chemical vapor deposition (CVD), or a combination thereof.

After deposition of the conductive material, excess conductive material is removed from the top side and the bottom side of the semiconductor substrate 10 by planarization employing an etch-back process, chemical mechanical planarization, or a combination thereof. Top surfaces of the first conductive TSV structure 80 and the second conductive TSV structure 82 are coplanar with a top surface of the hard mask layer 72. Bottom surfaces of the conductive TSV structure 80 and the second conductive TSV structure 82 are coplanar with a bottom surface of remaining portions of the first exemplary structure. The bottom surface of the remaining portions of the first exemplary structure can be, for example, an exposed surface of the node dielectric 70 if a bottom portion of the node dielectric 70 remains after planarization or any other exposed surfaces at the bottom of the first exemplary structure. The first conductive TSV structure 80 and the second conductive TSV structure 82 are formed concurrently by employing the same deposition process and the same planarization process.

Figure 18:
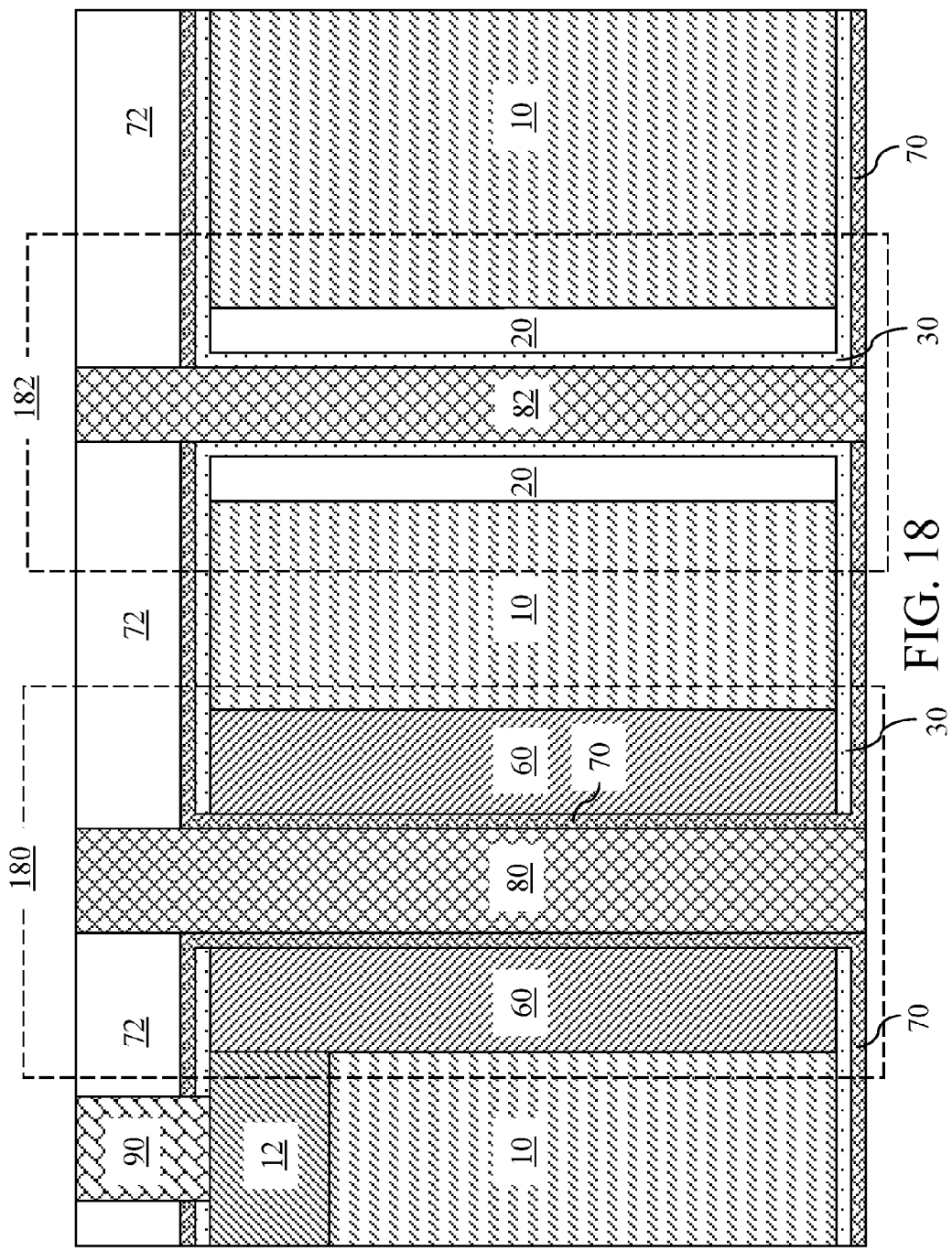

Referring to FIG. 18, a contact structure 90 is formed by forming a trench through the hard mask layer 72, the node dielectric 70, and the dielectric liner 30 and by filling the trench with a conductive material such as a doped semiconductor material or a metallic material. The contact structure 90 is conductively connected to the outer electrode 60 through the doped well region 12. The first conductive TSV structure 80, the node dielectric 70, and the outer electrode 60 collective constitute a capacitor 180, in which the first conductive TSV structure 80 is an inner electrode. The second conductive TSV structure 82, the portion of the dielectric liner contacting the second conductive TSV structure 82, and the dielectric tubular structure 20 collectively constitute an laterally-insulated conductive through-substrate connection structure 182. An end surface of the first conductive TSV structure 80, an end surface of the second conductive TSV structure 82, and an end surface of the contact structure 90 can be coplanar with an exposed surface of the hard mask layer 72.

The first exemplary structure can be incorporated in a semiconductor chip. For example, a plurality of instances of the capacitor 180 and a plurality of instances of the laterally-insulated conductive through-substrate connection structure 182 can be embedded in the same semiconductor substrate 10 of the semiconductor chip. The semiconductor chip may, or may not, include other semiconductor devices such as field effect transistors, bipolar transistors, thyristors, and diodes.

Each capacitor 180 can include an inner electrode, which includes a first conductive through-substrate via (TSV) structure 80, a node dielectric 70, and an outer electrode 60. The inner electrode contiguously extends at least from an upper surface of the semiconductor substrate 10 to a lower surface of the semiconductor substrate 10. The node dielectric 70 laterally contacts and laterally encloses the inner electrode. The node dielectric 70 contiguously extends from the upper surface to the lower surface. The outer electrode 60 laterally contacts and laterally encloses a portion of the node dielectric 70. The outer electrode 60 includes a doped semiconductor material.

The laterally-insulated conductive through-substrate connection structure 182 includes a second conductive TSV structure 82 located in the semiconductor substrate 10 and a dielectric tubular structure 20 laterally surrounding the second conductive TSV structure 82 and embedded in the semiconductor substrate 10. The laterally-insulated conductive through-substrate connection structure 182 can include a portion of the dielectric liner 30.

Figure 19:
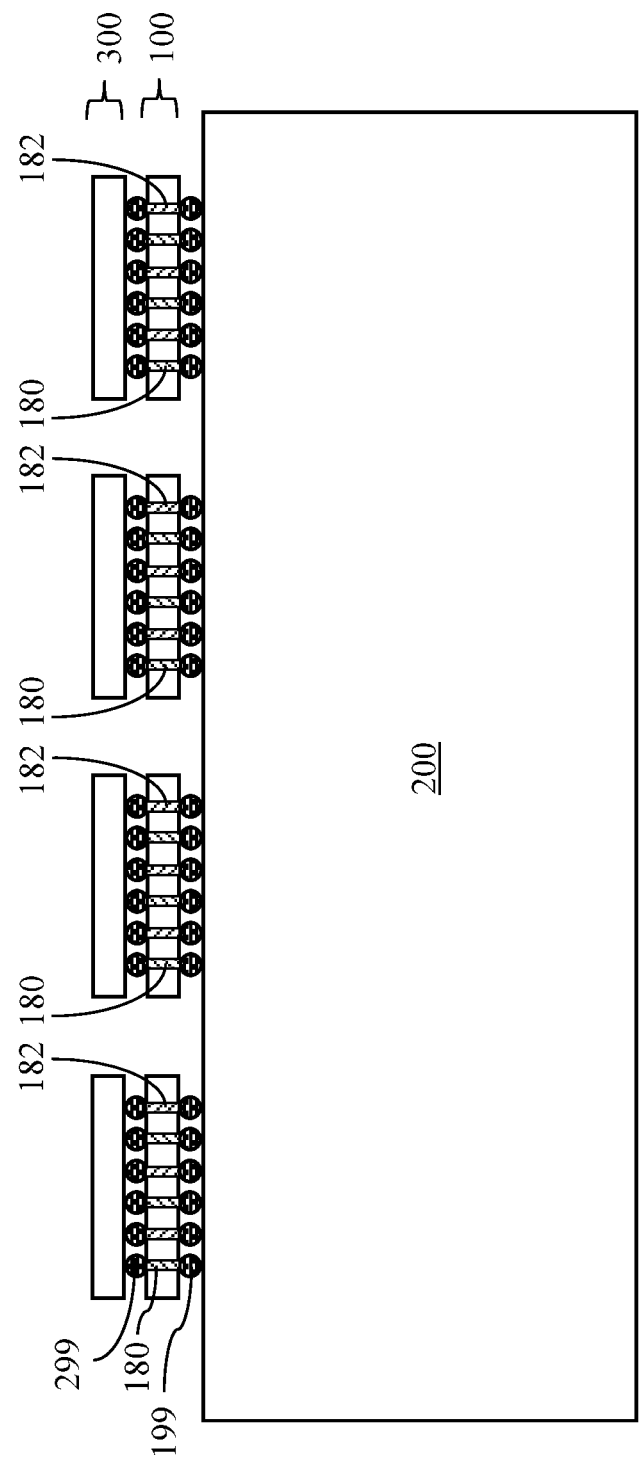
FIG. 19 is a vertical cross-sectional view of a second exemplary structure according to a second embodiment of the present invention.

Referring to FIG. 19, a second exemplary structure according to a second embodiment of the present invention includes a packaging substrate 200, a plurality of first semiconductor chips 100, a plurality of second semiconductor chips 300, an array of first solder balls 199 electrically connecting each of the first semiconductor chips 100 to the packaging substrate 200, and an array of second solder balls 299 electrically connecting each of the second semiconductor chips 300 to a first semiconductor chip 100. Each of the first semiconductor chips 100 includes at least one capacitor 180 and at least one laterally-insulated conductive through-substrate connection structure 182. The first semiconductor chips 100 may, or may not, include additional semiconductor devices such as field effect transistors, bipolar transistors, thyristors, and diodes. The second semiconductor chips 300 can include any type of semiconductor devices.

The capacitors 180 can function as decoupling capacitors that reduce noise in a power supply system that supplies power to the devices in the second semiconductor chips 300 and, if present, to the devices in the first semiconductor chips 100. Each capacitor 180 can provide a capacitance on the order of 1 pF to 10 nF, which is equivalent to the capacitance of 40-400,000 typical trench capacitors. Further, the capacitor 180 provides a lower inductance than a trench capacitor array that provides a comparable total capacitance. Thus, the capacitors 180 reduce noise in the power supply system especially during high frequency operations.

Figure 20:
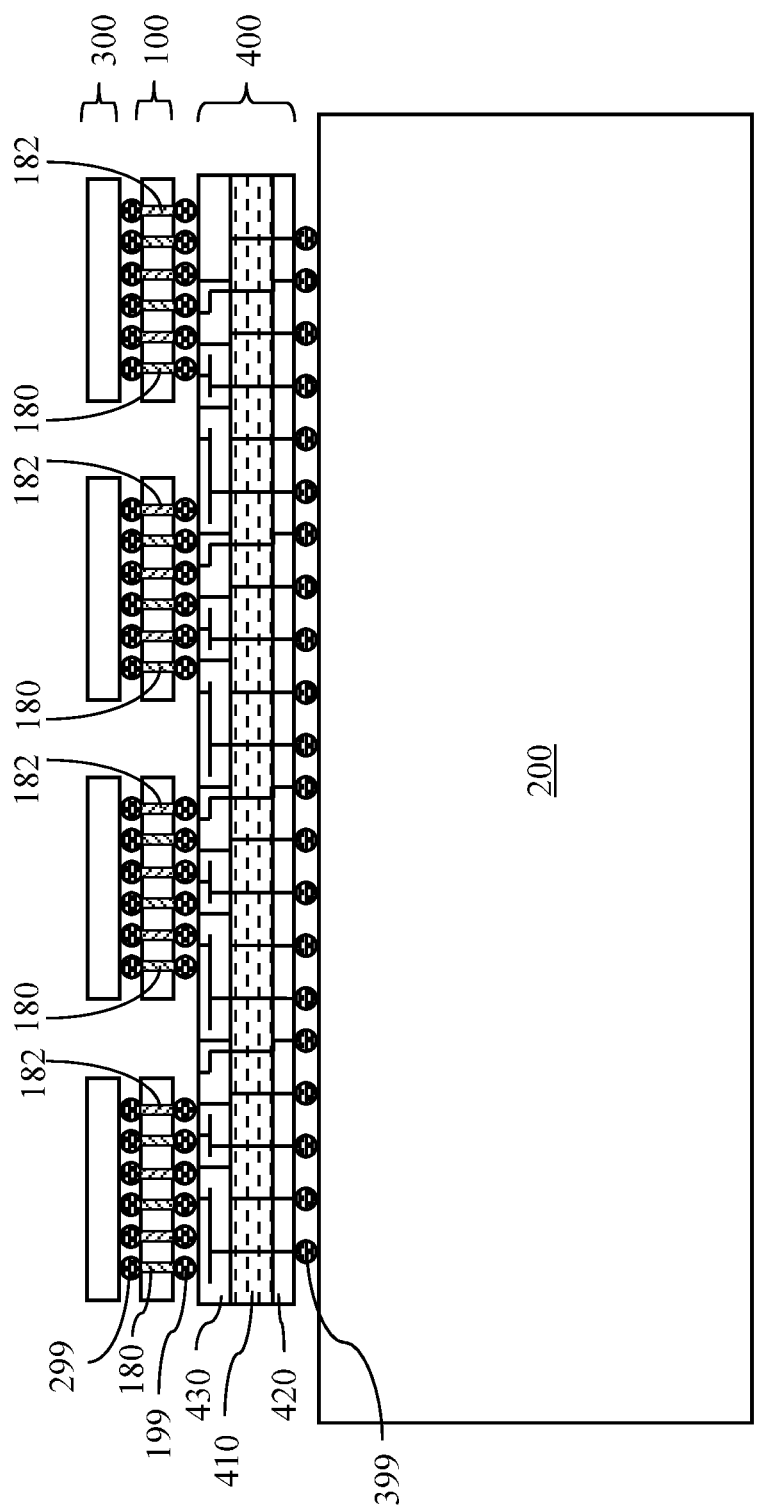
FIG. 20 is a vertical cross-sectional view of a third exemplary structure according to a third embodiment of the present invention.

Referring to FIG. 20, a third exemplary structure according to a third embodiment of the present invention includes a packaging substrate 200, a interposer structure 400, a plurality of first semiconductor chips 100, and a plurality of second semiconductor chips 300. An array of first solder balls 199 electrically connects each of the first semiconductor chips 100 to the interposer structure 400. An array of second solder balls 299 electrically connects each of the second semiconductor chips 300 to a first semiconductor chip 100. An array of third solder balls 399 connects the interposer structure 400 to the packaging substrate 200.

The interposer structure 400 can include an interposer structure substrate layer 410, a lower dielectric material layer 420, and an upper dielectric material layer 430. The interposer structure substrate layer 410 includes a plurality of through-substrate via structures that are schematically illustrated as vertical lines. The plurality of through-substrate via structures includes a plurality of capacitors 180 (See FIG. 18) and laterally-insulated conductive through-substrate connection structure 182 (See FIG. 18). The lower dielectric material layer 420 and the upper dielectric material layer 430 can include metal lines that provide electrical wiring within the lower dielectric material layer 420 or the upper dielectric material layer 430.

In general, a semiconductor chip including at least one capacitor 180 and at least one laterally-insulated conductive through-substrate connection structure 182 can be mounted a mounting structure, which can be any structure on which the semiconductor chip can be mounted with electrical connections thereto. The mounting structure can be, but is not limited to, a packaging substrate 200, an interposer structure 400, an assembly of an interposer structure 400 and a packaging substrate 200, or another semiconductor chip such as a second semiconductor chip 300.

Figure 21:
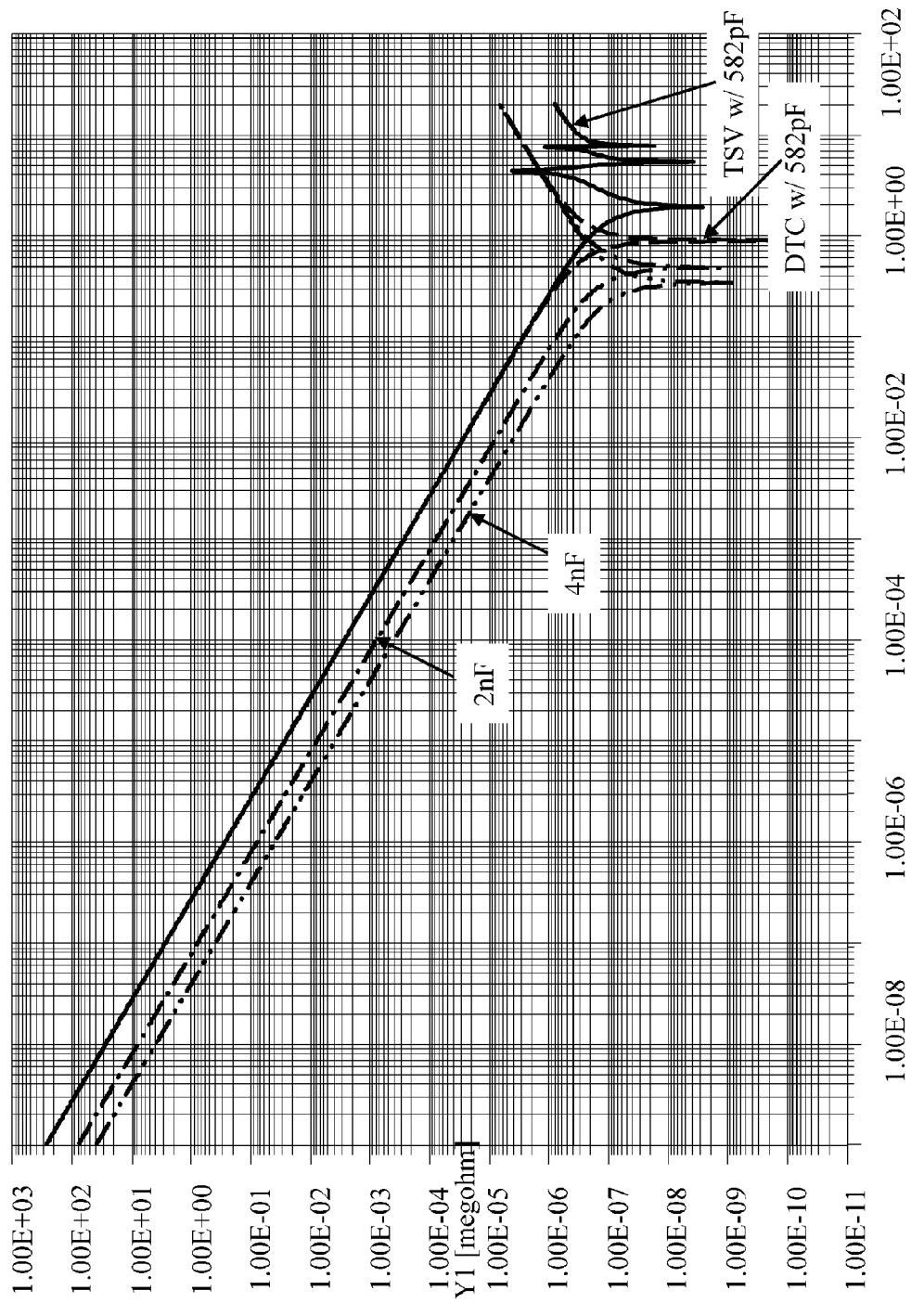
FIG. 21 is a graph showing results of a simulation that shows a noise reduction at high frequency provided by an exemplary structure according to an embodiment of the present invention.

Referring to FIG. 21, a graph shows results of a simulation that shows a noise reduction at high frequency provided by an exemplary structure according to an embodiment of the present invention. The horizontal axis represents frequency of a noise component in a power supply system, and the vertical axis represents an equivalent impedance of a decoupling system including either a capacitor 180 (See FIG. 18) according to an embodiment of the present invention or an array of trench capacitors according to prior art. The electrical noise in a power supply system is proportional to the equivalent impedance. The curve labeled "TSV w/582 pF" represents the equivalent impedance of a capacitor 180 having a capacitance of 582 pF and constructed according to an embodiment of the present invention, e.g., as shown in FIG. 18. The curves labeled "DTC w/582 pF," "2 nF," and "4 nF" represent the equivalent impedance of trench capacitor arrays having a total capacitance of 582 pF, 2 nF, and 4 nF, respectively.

At a frequency range below 0.1 GHz, the voltage noise in the system power supply is limited by the total capacitance of a decoupling capacitor system. Above 1 GHz, however, the voltage noise in decoupling capacitor systems employing any of the trench capacitor arrays increases to with frequency on a converging curve irrespective of the total capacitance of the decoupling capacitor system because inductance of the decoupling capacitor system dominates. The decoupling capacitor system employing a capacitor 180 of an embodiment of the present invention provides a lower voltage noise at frequencies above 1.2 GHz except for a small frequency range between 4 GHz and 4.5 GHz because the capacitor 180 has a low inductance. Thus, the decoupling capacitor system employing a capacitor 180 of an embodiment of the present invention provides a superior performance in noise reduction while consuming less device area. In the second or third exemplary structure, if the first semiconductor chips 100 do not include a semiconductor device, the capacitors 180 can be formed without requiring any area in the third semiconductor chips 300. In the third exemplary structure, the capacitors 180 can be formed in a smaller area than an array of trench capacitors having a comparable total capacitance, thereby providing more area for other semiconductor devices that can be included in the first semiconductor chips 100.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    forming a capacitor and an laterally-insulated conductive through-substrate connection structure in a semiconductor substrate,
    wherein said forming said laterally-insulated conductive through-substrate connection structure and said capacitor comprises:
        forming a dielectric tubular structure around a first through-substrate cavity formed in said semiconductor substrate;
        filling said first through-substrate cavity with a disposable material;
        forming an outer electrode by doping a portion of said semiconductor substrate around a second through-substrate cavity;
        forming a node dielectric on a surface of said second through-substrate cavity; removing said disposable material from said first through-substrate cavity within said dielectric tubular structure; filling said first through-substrate cavity with said dielectric tubular structure with a conductive material; and
        forming an inner electrode by filling said second through-substrate cavity with said conductive material.

2. The method of claim 1, wherein said inner electrode constitutes a first conductive through-substrate via (TSV) structure, a second conductive TSV structure is formed in said cavity filled by said conductive material, and said first conductive TSV structure and said second conductive TSV structure are formed concurrently.

3. The method of claim 2, wherein at least one of the first TSV, and the second TSV is composed of a material selected from the group consisting of doped polysilicon, doped silicon-containing alloy, Cu, W, Ta, Ti, WN, TaN, TiN, or a combination thereof.

4. The method of claim 2, wherein at least one of the first TSV and the second TSV by electroplating, electroless plating, physical vapor deposition (PVD), chemical vapor deposition (CVD), or a combination thereof.

5. The method of claim 1, wherein the disposable material is polysilicon or amorphous silicon.

6. The method of claim 1, further comprising forming said node dielectric directly on sidewalls of said doped tubular portion while said disposable material is present in said semiconductor substrate.

7. The method of claim 6, wherein the node dielectric has a thickness ranging from 3 nm to 30 nm.

8. The method of claim 1, further comprising:
    filling said second through-substrate cavity with a second disposable material after forming said outer electrode;
    forming a hard mask layer on one side of said semiconductor substrate; and
    removing said disposable material and said second disposable material employing said hard mask layer as an etch mask.

9. A method of forming a semiconductor structure comprising:
    providing a semiconductor chip including:
        providing a semiconductor substrate;
        forming at least one capacitor embedded in said semiconductor substrate, said at least one capacitor including an inner electrode comprising a conductive through-substrate via (TSV) structure; and
        forming at least one laterally-insulated conductive through-substrate connection structure, wherein said forming at least one laterally-insulated conductive through-substrate connection structure comprises:
  forming a dielectric tubular structure around a first through-substrate cavity formed in said semiconductor substrate,
  filling said first through-substrate cavity with a disposable material,
  removing said disposable material from said first through-substrate cavity within said dielectric tubular structure before forming said inner electrode of said at least one capacitor, and
  filling said cavity within said dielectric tubular structure with a conductive material; and
electrically connecting said semiconductor chip to a mounting structure employing an array of solder balls.

10. The method of claim 9, wherein the conductive TSV is composed of a material selected from the group consisting of doped polysilicon, doped silicon-containing alloy, Cu, W, Ta, Ti, WN, TaN, TiN, or a combination thereof.

11. The method of claim 9, wherein the mounting structure includes an interposer structure.

12. The method of claim 9, wherein the semiconductor chip further comprises field effect transistors, thyristors, bipolar transistors, diodes and combinations thereof.

13. The method of claim 9, wherein the capacitors are decoupling capacitors.

14. The method of claim 13, wherein the decoupling capacitors have a capacitance ranging from 1 pF to 10 nF.

15. The method of claim 11, wherein the interposer includes a dielectric layer and a plurality of metal lines.

16. The method of claim 9, wherein first solder balls among said array are electrically connected to said inner electrodes and first conductive structures on said mounting structure, and second solder balls among said array are electrically connected to conductive TSV structures within said at least one laterally-insulated conductive through-substrate connection structure and second conductive structures on said mounting structure.

17. The method of claim 9, wherein said mounting structure is selected from a packaging substrate, an interposer structure, and another semiconductor chip.

18. The method of claim 9, wherein each of said at least one capacitor includes a node dielectric laterally contacting and laterally enclosing said inner electrode and an outer electrode laterally contacting and laterally enclosing a portion of said node dielectric, and each of said at least one laterally-insulated conductive through-substrate connection structure includes a conductive TSV structure and a dielectric tubular structure.

* * * * *